US011870613B2

(12) United States Patent
Tachibana

(10) Patent No.: US 11,870,613 B2
(45) Date of Patent: Jan. 9, 2024

(54) SEMICONDUCTOR INTEGRATED CIRCUIT AND RECEIVER DEVICE

(71) Applicant: Kioxia Corporation, Tokyo (JP)

(72) Inventor: Fumihiko Tachibana, Yokohama (JP)

(73) Assignee: Kioxia Corporation, Tokyo (JP)

( * ) Notice: Subject to any disclaimer, the term of this patent is extended or adjusted under 35 U.S.C. 154(b) by 15 days.

(21) Appl. No.: 17/807,265

(22) Filed: Jun. 16, 2022

(65) Prior Publication Data

US 2023/0261911 A1 Aug. 17, 2023

(30) Foreign Application Priority Data

Feb. 17, 2022 (JP) .................................. 2022-023156

(51) Int. Cl.
*H04L 25/03* (2006.01)
*H03L 7/08* (2006.01)
*H03L 7/089* (2006.01)
*H04L 25/49* (2006.01)
*H04L 7/00* (2006.01)
*H03M 1/12* (2006.01)

(52) U.S. Cl.
CPC ............ *H04L 25/03* (2013.01); *H03L 7/0807* (2013.01); *H03L 7/089* (2013.01); *H03M 1/12* (2013.01); *H04L 7/0087* (2013.01); *H04L 25/03057* (2013.01); *H04L 25/4917* (2013.01)

(58) Field of Classification Search
CPC ..... H04L 7/0079; H04L 7/0087; H04L 25/49; H04L 25/4917; H04L 25/03; H04L 25/03006; H04L 25/03019; H04L 25/03057; H03L 7/08; H03L 7/0807; H03L 7/089; H03M 1/12
See application file for complete search history.

(56) References Cited

U.S. PATENT DOCUMENTS

| 10,103,870 B2 | 10/2018 | Shibasaki |
| 10,142,089 B2 * | 11/2018 | Yao ....................... H03L 7/0807 |
| 10,193,685 B2 | 1/2019 | Kudo |
| 10,498,562 B2 | 12/2019 | Norimatsu |
| 11,070,351 B1 * | 7/2021 | Chepuri .............. H04L 25/4917 |
| 11,552,643 B1 | 1/2023 | Tachibana |
| 2020/0249714 A1 * | 8/2020 | Cai ........................ H04L 7/0334 |

FOREIGN PATENT DOCUMENTS

| JP | 6518836 B2 | 5/2019 |
| JP | 6849903 B2 | 3/2021 |
| JP | 6912702 B2 | 8/2021 |
| JP | 2023-44289 A | 3/2023 |

* cited by examiner

*Primary Examiner* — Betsy Deppe
(74) *Attorney, Agent, or Firm* — Oblon, McClelland, Maier & Neustadt, L.L.P.

(57) ABSTRACT

According to one embodiment, a semiconductor integrated circuit includes: a converter configured to convert an analog signal into a digital signal based on a clock signal; a comparator configured to determine first data having data of a first number of bits per symbol and second data having data of a second number of bits, less than the first number, per symbol based on the digital signal; a recovery circuit configured to recover the clock signal; and a control circuit configured to input the digital signal and the first data to the recovery circuit in a case where a condition is not satisfied, and to input the digital signal and the second data to the recovery circuit in a case where the condition is satisfied.

20 Claims, 12 Drawing Sheets

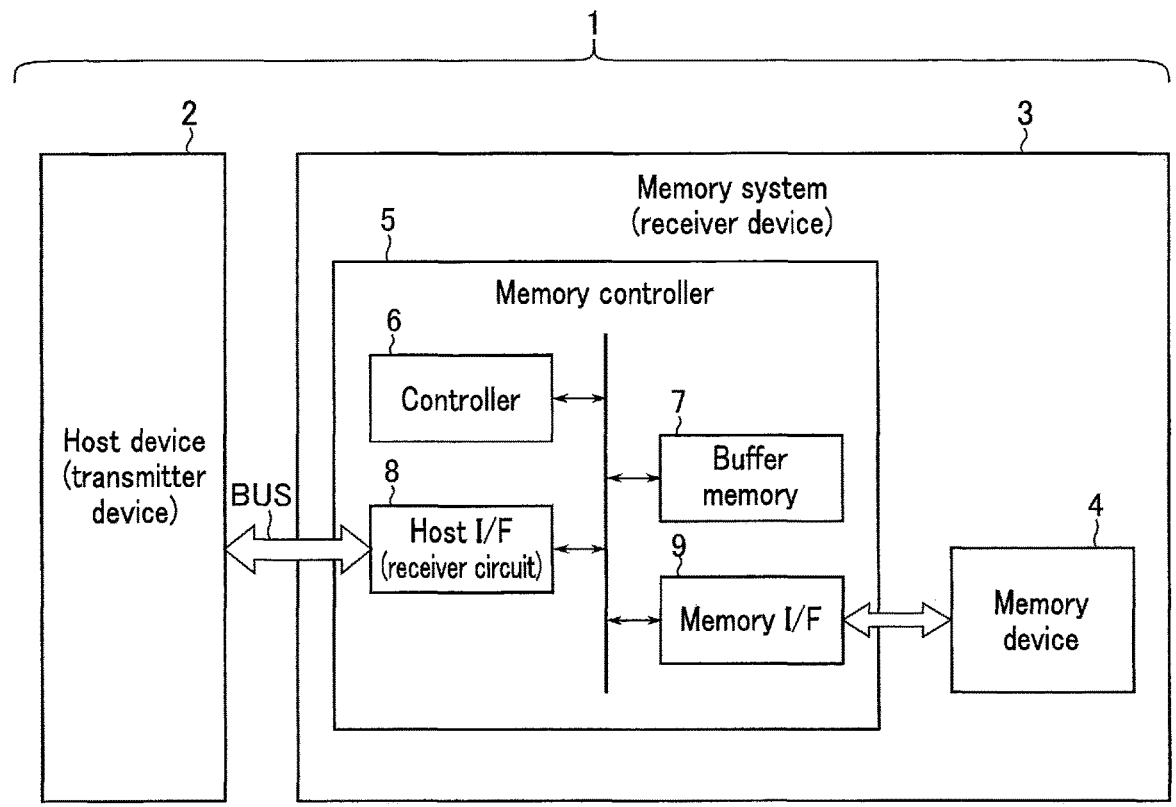
F I G. 1
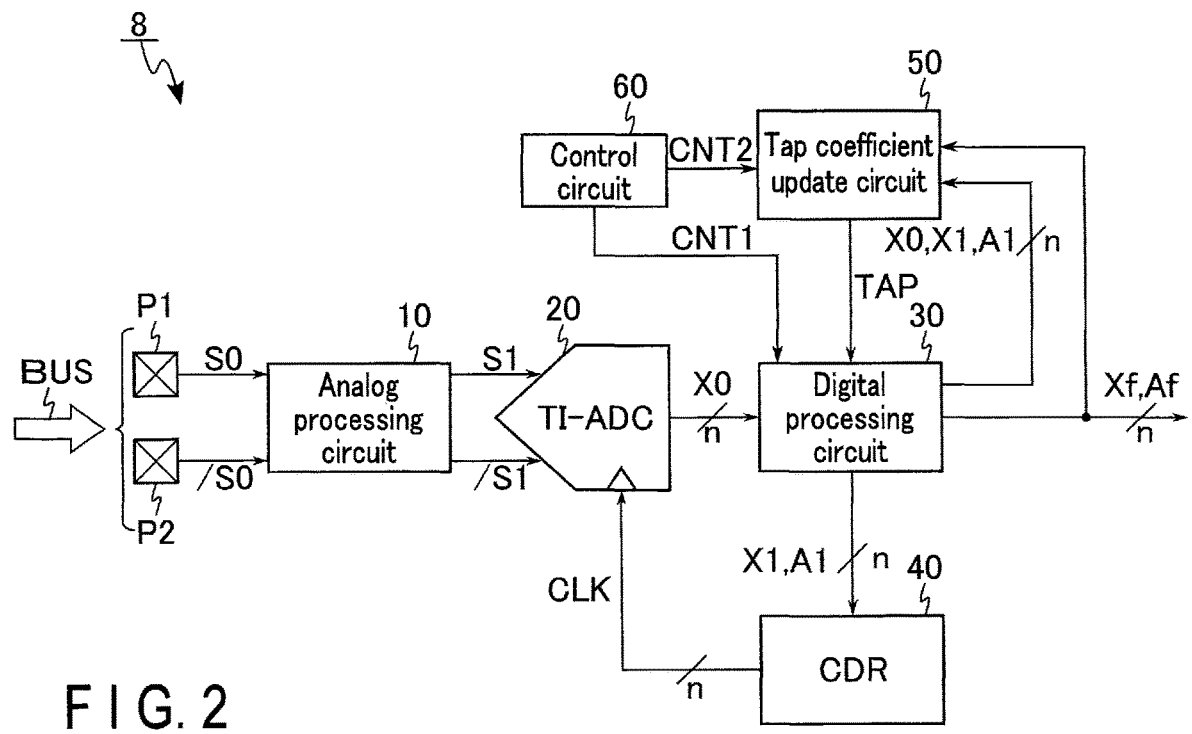
F I G. 2

| A1a<i> | -3 | -1 | +1 | +3 |
|---|---|---|---|---|

| A1b<i> | -3 | -3 | +3 | +3 |
|---|---|---|---|---|

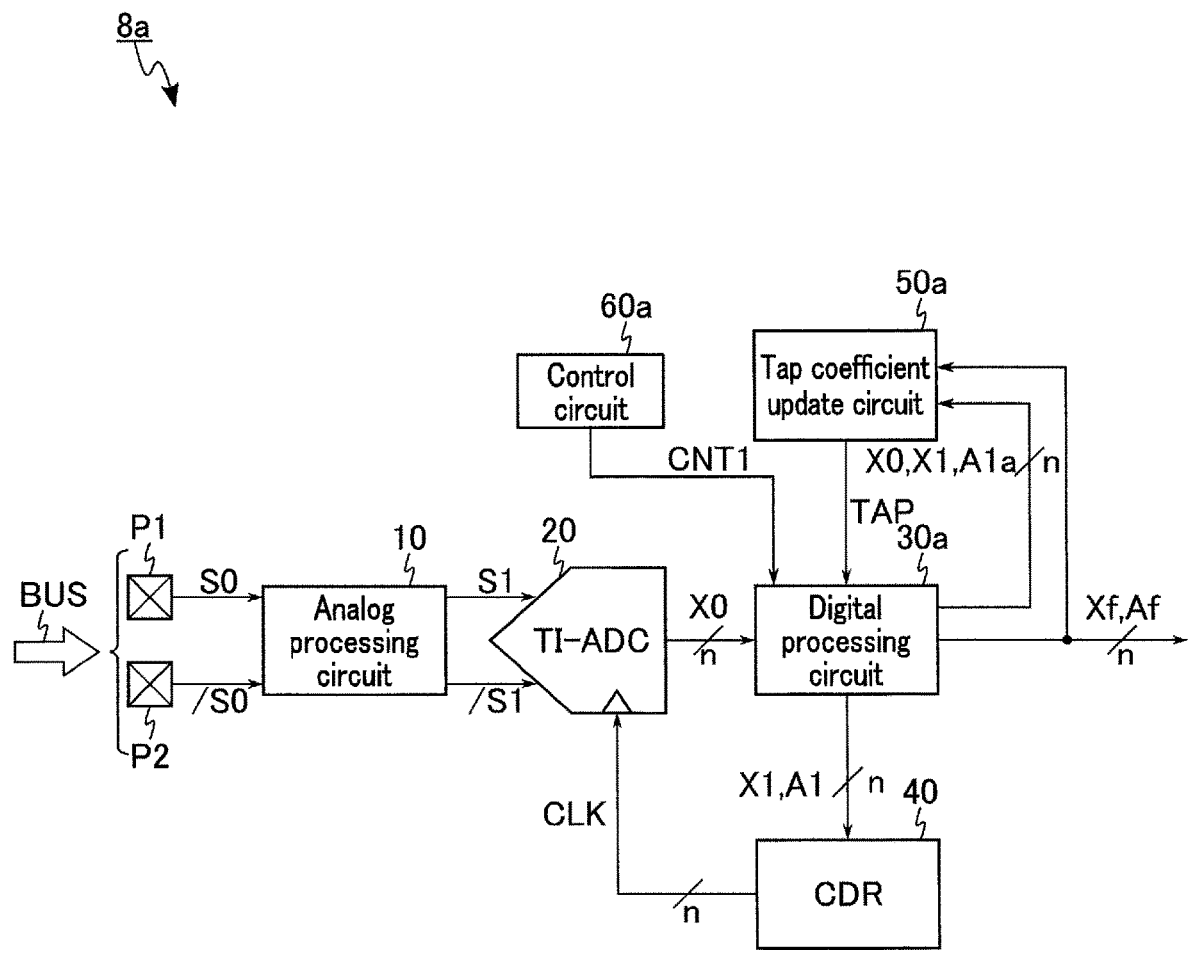
F I G. 10

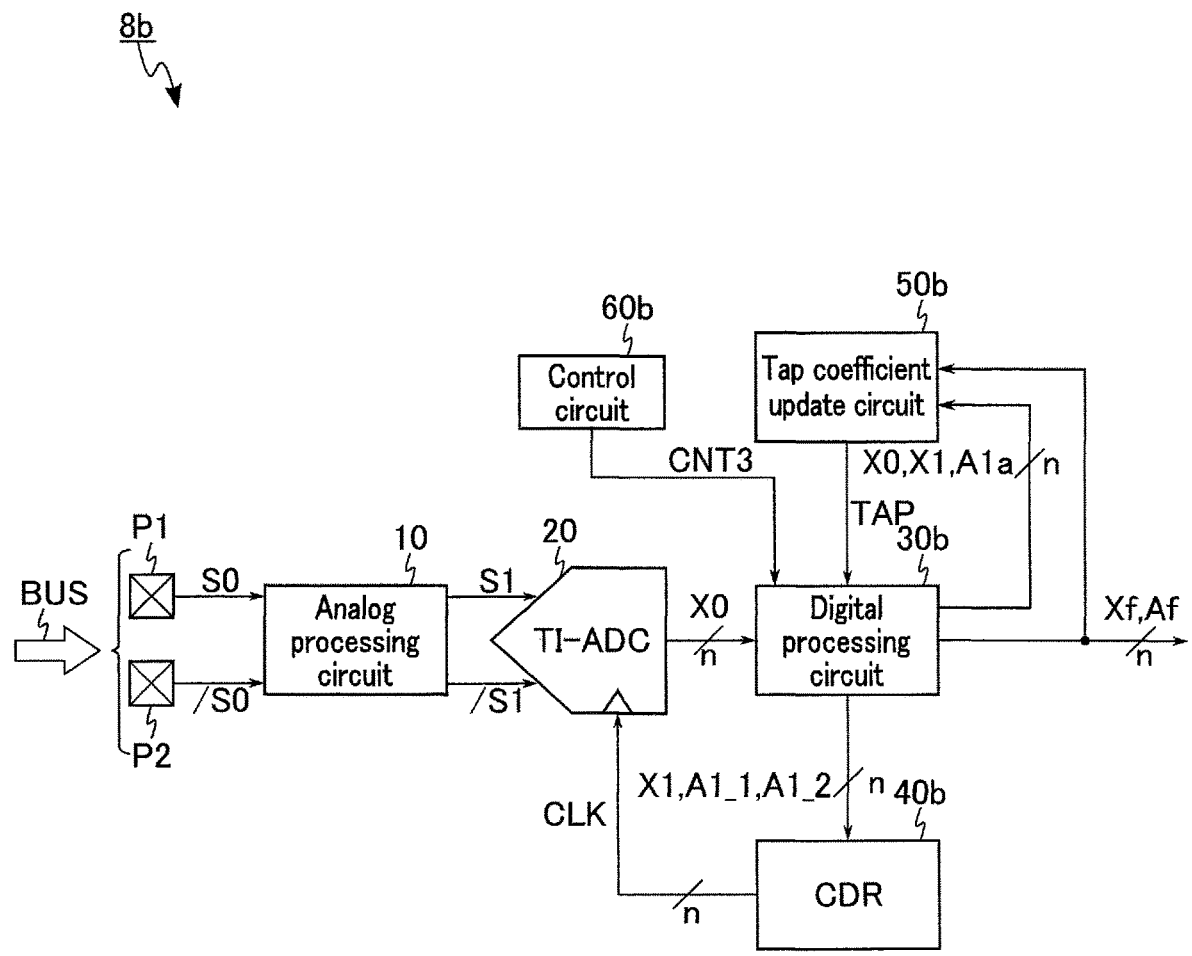
F I G. 13

SEMICONDUCTOR INTEGRATED CIRCUIT AND RECEIVER DEVICE

CROSS-REFERENCE TO RELATED APPLICATIONS

This application is based upon and claims the benefit of priority from Japanese Patent Application No. 2022-023156, filed Feb. 17, 2022, the entire contents of which are incorporated herein by reference.

FIELD

Embodiments described herein relate generally to a semiconductor integrated circuit and a receiver device.

BACKGROUND

A transmitter device and a receiver device are coupled to each other via a transmission path. The receiver device receives a reception signal having passed through the transmission path. The receiver device includes a semiconductor integrated circuit configured to processes the reception signal. The receiver device recovers a clock signal based on the reception signal. The receiver device recovers data from the reception signal based on the recovered clock signal. The receiver device includes a clock data recovery circuit configured to recover the clock signal and the data based on the reception signal.

BRIEF DESCRIPTION OF THE DRAWINGS

FIG. 1 is a block diagram illustrating an example of a configuration of an information processing system including a receiver device according to a first embodiment.

FIG. 2 is a block diagram illustrating an example of a configuration of a receiver circuit according to the first embodiment.

FIG. 10 is a block diagram illustrating an example of a configuration of a receiver circuit according to a second embodiment.

FIG. 13 is a block diagram illustrating an example of a configuration of a receiver circuit according to a third embodiment.

DETAILED DESCRIPTION

Figures 3, 4:
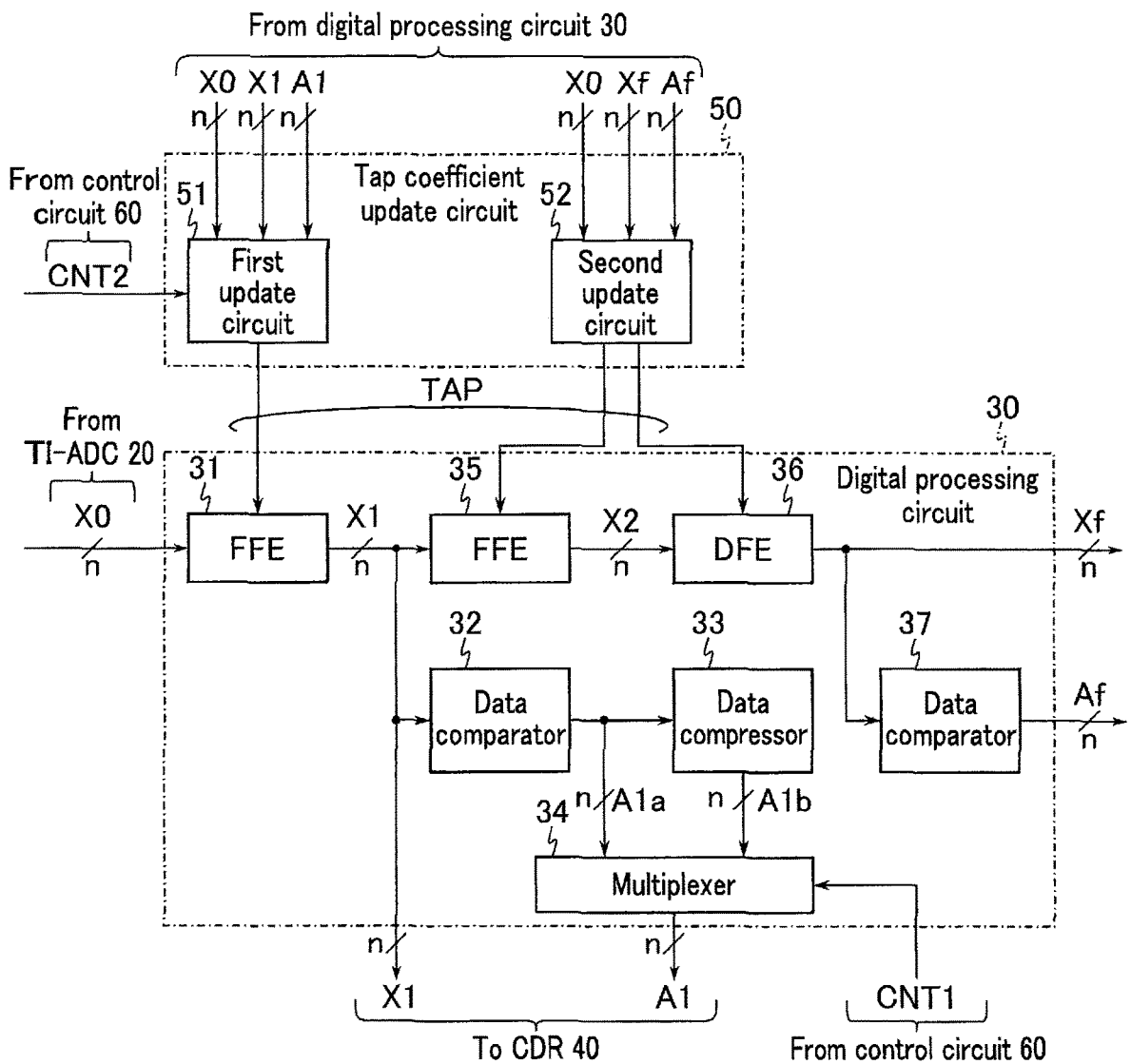
FIG. 3 is a block diagram illustrating an example of configurations of a digital processing circuit and a tap coefficient update circuit of the receiver circuit according to the first embodiment.
FIG. 4 is a diagram illustrating an example of a functional configuration of a data compressor of the digital processing circuit according to the first embodiment.

In general, according to one embodiment, a semiconductor integrated circuit includes: a converter configured to convert an analog signal into a digital signal based on a clock signal; a comparator configured to determine first data having data of a first number of bits per symbol and second data having data of a second number of bits, less than the first number, per symbol based on the digital signal; a recovery circuit configured to recover the clock signal; and a control circuit configured to input the digital signal and the first data to the recovery circuit in a case where a condition is not satisfied, and to input the digital signal and the second data to the recovery circuit in a case where the condition is satisfied.

Hereinafter, embodiments will be described with reference to the drawings.

The description provided hereinafter use the same reference symbol for components having approximately the same function and configuration. Especially when components having the same or substantially the same configuration are to be distinguished from each other, different characters or numerals may be added to the common reference symbol.

1. First Embodiment

A first embodiment will be described.

1.1 Configuration

A configuration according to the first embodiment will be described.

1.1.1 Information Processing System

First, a configuration of an information processing system including a receiver device according to the first embodiment will be described. FIG. 1 is a block diagram illustrating an example of the configuration of the information processing system including the receiver device according to the first embodiment.

An information processing system 1 is a system for transmitting information through serial communication. The information processing system 1 includes a host device 2 and a memory system 3. The memory system 3 can be coupled to the host device 2 via a host bus BUS.

The host device 2 is an information processing device installed outside the memory system 3. The host device 2 is, for example, a personal computer or a server installed in a data center. The host device 2 transmits various requests to the memory system 3. When transmitting a request to the memory system 3, the host device 2 functions as a transmitter device.

The memory system 3 is a storage device. The memory system 3 is, for example, a memory card such as an SD™ card, a universal flash storage (UFS) device, or a solid state drive (SSD). The memory system 3 executes a data write operation, a data read operation, and a data erase operation according to requests from the host device 2. When receiving a request from the host device 2, the memory system 3 functions as the receiver device.

1.1.2 Memory System

An internal configuration of the memory system according to the first embodiment will be described.

The memory system 3 includes a memory device 4 and a memory controller 5.

The memory device 4 is, for example, a nonvolatile memory. The memory device 4 is, for example, a NAND flash memory. The memory device 4 stores data in a nonvolatile manner.

The memory controller 5 is configured by, for example, an integrated circuit such as a system-on-a-chip (SoC). The memory controller 5 controls the memory device 4 based on a request from the host device 2. Specifically, for example, the memory controller 5 writes write data to the memory device 4 based on a write request from the host device 2. In addition, the memory controller 5 reads read data from the memory device 4 based on a read request from the host device 2. Then, the memory controller 5 transmits the read data to the host device 2.

Next, an internal configuration of the memory controller 5 will be described. The memory controller 5 includes a controller 6, a buffer memory 7, a host interface circuit 8 (host I/F), and a memory interface circuit 9 (memory I/F). Functions of the memory controller 5 to be described hereinafter can be implemented by either a hardware configuration or a combination configuration of hardware resources and firmware.

The controller 6 is a circuit that controls the entire memory controller 5. The controller 6 includes, for example, a processor, such as a central processing unit (CPU), and a read only memory (ROM).

The buffer memory 7 is, for example, a static random access memory (SRAM). The buffer memory 7 buffers data transmitted between the host device 2 and the memory device 4. The buffer memory 7 temporarily stores the write data and the read data.

The host interface circuit 8 includes a semiconductor integrated circuit. The host interface circuit 8 manages communication between the memory controller 5 and the host device 2. When receiving a request from the host device 2, a partial circuit of the host interface circuit 8 functions as a receiver circuit. The host interface circuit 8 is coupled to the host device 2 via a host bus BUS. The host bus BUS conforms to, for example, an SD™ interface, a serial attached SCSI (small computer system interface) (SAS), a serial ATA (advanced technology attachment) (SATA), or a PCI (peripheral component interconnect) Express™ (PCIe).

The memory interface circuit 9 includes a semiconductor integrated circuit. The memory interface circuit 9 manages communication between the memory device 4 and the memory controller 5. The memory interface circuit 9 is coupled to the memory device 4 via a memory bus. The memory bus conforms to, for example, a single data rate (SDR) interface, a toggle double data rate (DDR) interface, or an open NAND flash interface (ONFI).

1.1.3 Host Interface Circuit (Receiver Circuit)

Next, an internal configuration of a portion corresponding to the receiver circuit provided in the host interface circuit according to the first embodiment will be described. FIG. 2 is a block diagram illustrating an example of a configuration of the receiver circuit of the receiver device according to the first embodiment.

The host interface circuit 8 includes pads P1 and P2, an analog processing circuit 10, a TI-ADC 20, a digital processing circuit 30, a CDR 40, a tap coefficient update circuit 50, and a control circuit 60.

Each of the pads P1 and P2 is a terminal coupled to the host bus BUS. The example of FIG. 2 illustrates a case where the pads P1 and P2 receive signals S0 and /S0, respectively, from the host device 2 via the host bus BUS.

The signals S0 and /S0 are differential signals. Before passing through the host bus BUS, the signals S0 and /S0 are, for example, pulse signals having a plurality of pulses. Data from the host device 2 is modulated to each pulse of the signals S0 and /S0. A voltage level of each pulse of the signals S0 and /S0 corresponds to one bit of data or a plurality of bits of data. In the following description, a case where 2-bit data is modulated for one pulse is assumed. Such a data transmission scheme is also referred to as four-level pulse amplitude modulation (PAM4).

The signals S0 and /S0 suffer a loss due to a transmission characteristic (for example, frequency characteristic) of the host bus BUS while passing through the host bus BUS. Accordingly, inter-symbol interference (ISI) occurs in the signals S0 and /S0 that have passed through the host bus BUS. Thus, the signals S0 and /S0 that have passed through the host bus BUS are processed as analog signals.

The analog processing circuit 10 is an analog front end (AFE). The analog processing circuit 10 includes, for example, a continuous time linear equalizer (CTLE) and a variable gain amplifier (VGA). The CTLE is an amplifier circuit having a frequency characteristic that compensates for the frequency characteristic of the host bus BUS. The VGA is an amplifier circuit capable of changing a gain. The signals S0 and /S0 are input to the analog processing circuit 10 from the pads P1 and P2, respectively. The analog processing circuit 10 executes analog processing on the signals S0 and /S0 using the CTLE and the VGA. The analog processing circuit 10 generates signals S1 and /S1 based on the signals S0 and /S0. The analog processing circuit 10 outputs the signals S1 and /S1 to the TI-ADC 20.

The TI-ADC 20 is a time-interleaved AD converter. To the TI-ADC 20, the signals S1 and /S1 are input from the analog processing circuit 10, and a signal CLK is input from the CDR 40. The TI-ADC 20 converts the signals S1 and /S1 into a signal X0 based on the signal CLK. The TI-ADC 20 outputs the signal X0 to the digital processing circuit 30.

The signal CLK has n clock signals. Here, n is an integer of one or more (for example, 32). The n clock signals of the signal CLK have phases different from each other by, for example, at least 360°/n. A frequency of the signal CLK may be equal to a frequency of a clock signal embedded in the signals S0 and /S0 by the host device 2. The frequency of the signal CLK may be different from the frequency of the clock signal embedded in the signals S0 and /S0 by the host device 2.

The signal X0 is a digital signal. The signal X0 has a plurality of consecutive digital values. A value of a bit of one digital value included in the signal X0 is sampled from one symbol of the signals S1 and /S1 based on one clock signal of the signal CLK. One digital value is, for example, 7-bit data. A value of each bit of n consecutive digital values included in the signal X0 is sampled from n consecutive symbols of the signals S1 and /S1 based on the n clock signals of the signal CLK. Hereinafter, a generation cycle of the n consecutive digital values included in the signal X0 by the TI-ADC 20 is also simply referred to as a "cycle". In addition, the n consecutive digital values included in the signal X0 are also referred to as the "signal X0 of one cycle".

The digital processing circuit 30 includes, for example, a feed forward equalizer (FFE), a decision feedback equalizer (DFE), and a data comparator. A configuration of the digital processing circuit 30 will be described later. The signal X0 is input to the digital processing circuit 30. The digital processing circuit 30 performs digital processing on the signal X0 using the FFE, the DFE, and the data comparator. Specifically, the digital processing circuit 30 generates signals X1 and Xf, data A1 and Af based on the signal X0. The digital processing circuit 30 outputs the signal X1 and the data A1 to the CDR 40. The digital processing circuit 30 outputs the signals X0 and X1 and the data A1 to the tap coefficient update circuit 50. The digital processing circuit 30 outputs the signal Xf and the data Af to the tap coefficient update circuit 50 and a subsequent circuit (not illustrated). Details of the signals X1 and Xf, the data A1 and Af will be described later.

The CDR 40 is a clock data recovery circuit. The signal X1 and the data A1 are input to the CDR 40 every cycle. The CDR 40 calculates a phase correction amount of the signal CLK based on the signal X1 and the data A1. The CDR 40 recovers the signal CLK based on the calculated phase correction amount. The CDR 40 outputs the recovered signal CLK to the TI-ADC 20 every cycle. In this manner, based on the signal X1 and the data A1 generated from the signal X0 of one cycle, the CDR 40 recovers the signal CLK serving as a reference of a sampling timing of the signal X0 of the subsequent one cycle. Such cyclical processing performed by the TI-ADC 20, the digital processing circuit 30, and the CDR 40 every cycle is also referred to as a "CDR loop".

The tap coefficient update circuit 50 is an arithmetic circuit. The tap coefficient update circuit 50 generates a signal TAP based on a set of the signals X0 and X1 and the data A1 and a set of the signals X0 and Xf and the data Af received from the digital processing circuit 30. The signal TAP is a signal for controlling information (for example, a tap coefficient) related arithmetic functions of the FFE and the DFE of the digital processing circuit 30.

The control circuit 60 includes, for example, a processor, such as a CPU, and a ROM. The control circuit 60 controls the entire host interface circuit 8. Specifically, for example, the control circuit 60 controls the digital processing circuit 30 and the tap coefficient update circuit 50 based on signals CNT1 and CNT2, respectively. The signal CNT1 is a signal for controlling a value of the data A1 output from the digital processing circuit 30. The signal CNT2 is a signal for controlling whether or not to update the signal TAP output from the tap coefficient update circuit 50.

1.1.4 Digital Processing Circuit and Tap Coefficient Update Circuit

Next, internal configurations of the digital processing circuit and the tap coefficient update circuit of the receiver circuit according to the first embodiment will be described. FIG. 3 is a block diagram illustrating an example of configurations of the digital processing circuit and the tap coefficient update circuit of the receiver circuit according to the first embodiment.

First, the configuration of the digital processing circuit 30 will be described. The digital processing circuit 30 includes an FFE 31, a data comparator 32, a data compressor 33, a multiplexer 34, an FFE 35, a DFE 36, and a data comparator 37.

The signal X0 is input to the FFE 31. The FFE 31 executes arithmetic processing using a digital value to be calculated and digital values of several symbols before and after the digital value to be calculated for each of n digital values included in the signal X0 of one cycle. For the arithmetic processing performed by the FFE 31, a tap coefficient based on a part of the signal TAP input from the tap coefficient update circuit 50 is used. The FFE 31 generates the signal X1 as a result of the arithmetic processing. That is, the signal X1 is a digital signal similarly to the signal X0. The signal X1 of one cycle is a set of n digital values. The FFE 31 outputs the signal X1 to the data comparator 32 and the FFE 35. Further, the signal X1 is also output to the CDR 40 and the tap coefficient update circuit 50.

The signal X1 is input to the data comparator 32. The data comparator 32 determines data encoded by the host device 2 as data A1a based on the signal X1. Specifically, when PAM4 is applied, the data comparator 32 determines 2-bit data for each of n digital values included in the signal X1 of one cycle. That is, the data A1a has 2-bit data for each of n digital values included in the signal X1 of one cycle. For example, the 2-bit data corresponds to any of "−3", "−1", "+1", and "+3". The data comparator 32 outputs the data A1a to the data compressor 33 and the multiplexer 34.

The data A1a is input to the data compressor 33. The data compressor 33 compresses the data A1a into data A1b. The data A1b has 1-bit data for each of n digital values included in the signal X1 of one cycle. For example, the 1-bit data corresponds to any of "−3" and "+3". The data compressor 33 outputs the data A1b to the multiplexer 34.

FIG. 4 is a diagram illustrating an example of a functional configuration of the data compressor of the digital processing circuit according to the first embodiment. FIG. 4 illustrates a relationship between a value A1a<i> included in the data A1a to be compressed and a value A1b<i> included in the data A1b that has been compressed by the data compressor 33. The value A1a<i> is a digital value corresponding to the ith symbol among n pieces of 2-bit data included in the data A1a (0≤i≤n−1). The value A1b<i> is a digital value corresponding to the ith symbol among n pieces of 1-bit data included in the data A1b, and corresponds to the value A1a<i>.

As illustrated in FIG. 4, when the value A1a<i> indicates "−3", the data compressor 33 outputs the value A1b<i> indicating "−3". When the value A1a<i> indicates "−1", the data compressor 33 outputs the value A1b<i> indicating "−3". When the value A1a<i> indicates "+1", the data compressor 33 outputs the value A1b<i> indicating "+3". When the value A1a<i> indicates "+3", the data compressor 33 outputs the value A1b<i> indicating "+3". With the above configuration, the data compressor 33 can compress the data A1a, which is 2-bit data, into the data A1b which is 1-bit data.

Note that the data comparator 32 and the data compressor 33 may be considered as one comparator that determines the data A1a and the data A1b based on the signal X1 and outputs a determination result.

Returning to FIG. 3 again, the configuration of the digital processing circuit 30 will be described.

The data A1a and the data A1b are input to the multiplexer 34 from the data comparator 32 and the data compressor 33, respectively. In addition, the signal CNT1 is input from the control circuit 60 to the multiplexer 34. The multiplexer 34 outputs any one of the data A1a and the data A1b based on the signal CNT1. The output of the multiplexer 34 is output to the CDR 40 and the tap coefficient update circuit 50. That is, the multiplexer 34 switches data to be output to the CDR 40 and the tap coefficient update circuit 50 between the data A1a and the data A1b according to the signal CNT1.

Note that, in the following description, it can be said that the digital processing circuit 30 is in a "PAM4 mode" in a case where the data A1a is output as the data A1. It can be said that the digital processing circuit 30 is in a "non-return to zero (NRZ) mode" in a case where the data A1b is output as the data A1.

The signal X1 is input to the FFE 35. Note that the signal input to the FFE 35 may be a signal X1' (not illustrated) different from the signal X1 that is input to the data comparator 32 and the CDR 40. In this case, the signal X1' that is input to the FFE 35 is generated based on the signal X1. The FFE 35 executes arithmetic processing using a digital value to be calculated and digital values of several symbols before and after the digital value to be calculated for each of n digital values included in the signal X1 of one cycle. For the arithmetic processing performed by the FFE 35, a tap coefficient based on a part of the signal TAP input from the tap coefficient update circuit 50 is used. Note that the tap coefficient that is applied to the FFE 35 may be different from the tap coefficient that is applied to the FFE 31. The FFE 35 generates a signal X2 as a result of the arithmetic processing. That is, the signal X2 is a digital signal similarly to the signals X0 and X1. The signal X2 of one cycle is a set of n digital values. The FFE 35 outputs the signal X2 to the DFE 36.

The signal X2 is input to the DFE 36. The DFE 36 executes arithmetic processing based on a digital value to be calculated and digital values of several symbols before and after the digital value to be calculated for each of n digital values included in the signal X2 of one cycle. For the arithmetic processing performed by the DFE 36, a tap coefficient based on a part of the signal TAP input from the tap coefficient update circuit 50 is used. The DFE 36 generates and outputs the signal Xf as a result of the arithmetic processing. That is, the signal Xf is a digital signal similarly to the signals X0, X1, and X2. The signal Xf of one cycle is a set of n digital values. The signal Xf generated by the DFE 36 is output to the data comparator 37, the tap coefficient update circuit 50, and a subsequent circuit.

The signal Xf is input to the data comparator 37. The data comparator 37 determines data encoded by the host device 2 as the data Af based on the signal Xf. Specifically, when PAM4 is applied, the data comparator 37 determines 2-bit data for each of n digital values included in the signal Xf of one cycle. The data Af determined by the data comparator 37 is output to the tap coefficient update circuit 50 and a subsequent circuit.

Next, the configuration of the tap coefficient update circuit 50 will be described. The tap coefficient update circuit 50 includes a first update circuit 51 and a second update circuit 52.

The signal X1 and the data A1 are input to the first update circuit 51 from the FFE 31 and the multiplexer 34, respectively. The signal X0 input to the digital processing circuit 30 is further input to the first update circuit 51. The first update circuit 51 generates a part of the signal TAP based on the signals X0 and X1 and the data A1, and outputs the part of the signal TAP to the FFE 31. The part of the signal TAP output from the first update circuit 51 is applied to the FFE 31 as the tap coefficient.

In addition, the signal CNT2 is input from the control circuit 60 to the first update circuit 51. The first update circuit 51 stops updating the signal TAP based on the signal CNT2. In a state in which the updating of the signal TAP is stopped, the first update circuit 51 continues to output the signal TAP that has been updated latest in a state in which the updating of the signal TAP is not stopped regardless of the signals X0 and X1 and the data A1 in the latest cycle.

The signal Xf and the data Af are input to the second update circuit 52 from the DFE 36 and the data comparator 37, respectively. The signal X0 input to the digital processing circuit 30 is further input to the second update circuit 52. The second update circuit 52 generates a part of the signal TAP based on the signals X0 and Xf and the data Af, and outputs the part of the signal TAP to the FFE 35 and the DFE 36. The part of the signal TAP output from the second update circuit 52 is applied to the FFE 35 and the DFE 36 as the tap coefficient.

1.1.5 Clock Data Recovery Circuit

Figure 5:
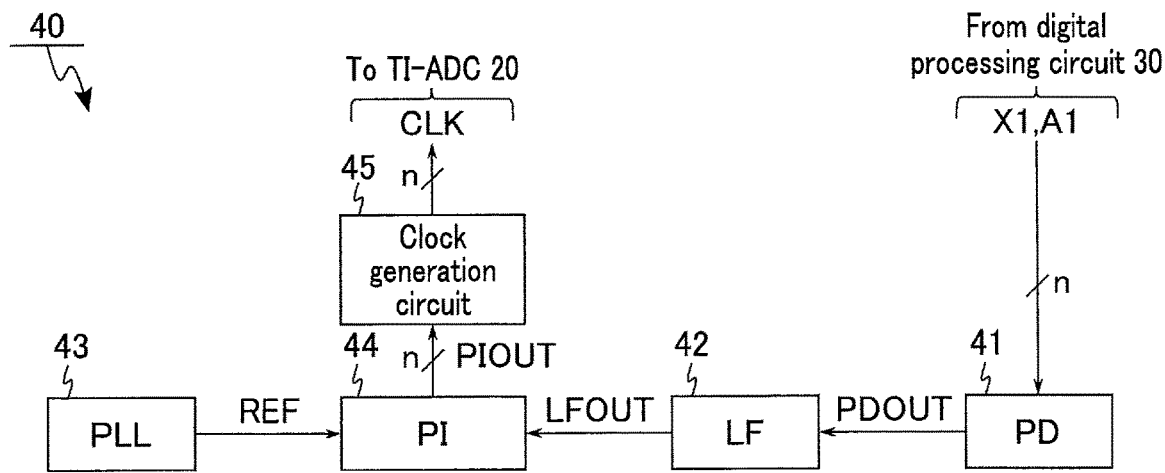
FIG. 5 is a block diagram illustrating an example of a configuration of a clock data recovery circuit of the receiver circuit according to the first embodiment.

Next, an internal configuration of the clock data recovery circuit (CDR) of the receiver circuit according to the first embodiment will be described. FIG. 5 is a block diagram illustrating an example of the configuration of the clock data recovery circuit of the receiver circuit according to the first embodiment.

The CDR 40 includes a PD 41, an LF 42, a PLL 43, a PI 44, and a clock generation circuit 45.

The PD 41 is a Mueller-Muller (MM) baud-rate phase detector. The MM baud-rate phase detector uses one sampling result per symbol when detecting a phase shift related to the signal CLK. In addition, the MM baud-rate phase detector does not use a sampling result of an edge (boundary) of a pulse corresponding to data that has been encoded into the signals S0 and /S0 when detecting the phase shift. The signal X1 and the data A1 are input to the PD 41 from the digital processing circuit 30. The PD 41 calculates a value PDOUT based on the signal X1 and the data A1. The value PDOUT is a value corresponding to a phase shift between a current sampling timing based on the signal CLK and an optimum sampling timing. The PD 41 outputs the value PDOUT to the LF 42.

The LF 42 is a loop filter. The value PDOUT is input to the LF 42. The LF 42 calculates a value LFOUT based on the value PDOUT. The value LFOUT is a value corresponding to the phase correction amount of the signal CLK. The LF 42 outputs the value LFOUT to the PI 44.

The PLL 43 is a phase locked loop circuit. The PLL 43 generates a signal REF. The signal REF is a reference signal having a reference frequency in the receiver circuit. The PLL 43 outputs the signal REF to the PI 44. In the following description, a difference between the reference frequency of the signal REF and a frequency of a clock signal embedded in the signals S0 and /S0 by the host device 2 is also referred to as a "frequency deviation".

The PI 44 is a phase interpolator. To the PI 44, the value LFOUT is input from the LF 42, and the signal REF is input from the PLL 43. The PI 44 generates a signal PIOUT from the signal REF based on the value LFOUT. The signal PIOUT is an n-phase signal whose phase has been corrected. The PI 44 outputs the signal PIOUT to the clock generation circuit 45.

The signal PIOUT is input to the clock generation circuit 45. The clock generation circuit 45 generates the signal CLK based on the signal PIOUT. The clock generation circuit 45 uses, for example, a frequency divider circuit to generate the signal CLK. The signal CLK generated by the clock generation circuit 45 is output to the TI-ADC 20.

1.1.6 Phase Detector

Figure 6:
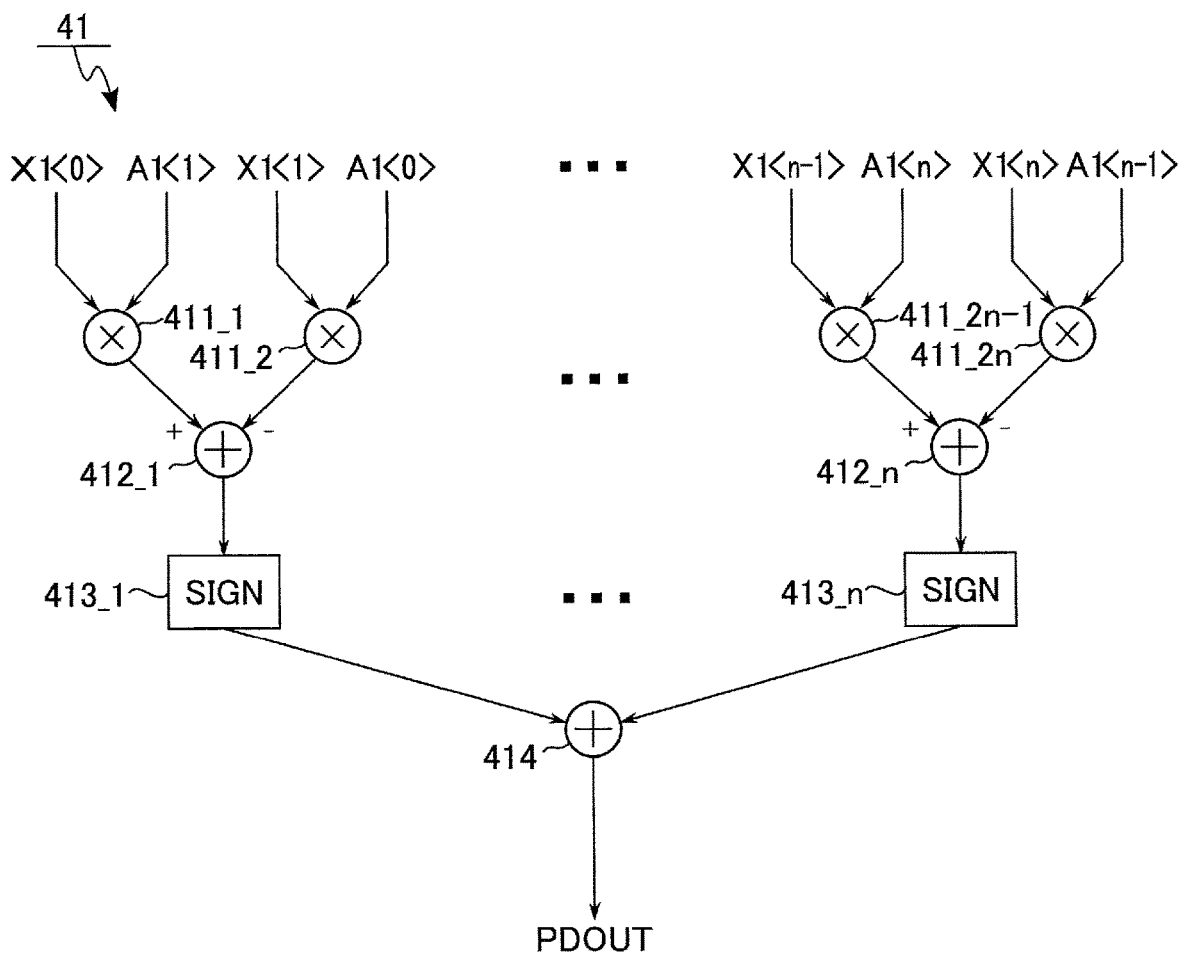
FIG. 6 is a block diagram illustrating an example of a configuration of a phase detector of the clock data recovery circuit according to the first embodiment.

Next, an internal configuration of the phase detector (PD) of the clock data recovery circuit according to the first embodiment will be described. FIG. 6 is a block diagram illustrating an example of the configuration of the phase detector of the clock data recovery circuit according to the first embodiment.

The PD 41 includes a plurality of multipliers 411, a plurality of adders 412, a plurality of sign function circuits 413, and an adder 414. The plurality of multipliers 411 includes 2n multipliers 411_1, 411_2, ..., 411_(2k−1) (not illustrated), 411_2k (not illustrated), ..., 411_(2n−1), and 411_2n. The plurality of adders 412 includes n adders 412_1, ..., 412_k (not illustrated), ..., and 412_n. The plurality of sign function circuits 413 includes n sign function circuits 413_1, ..., 413_k (not illustrated), ..., and 413_n. Here, k is an integer equal to or more than two and equal to or less than (n−1) (2≤k≤n−1).

In FIG. 6, n digital values included in the signal X1 of one cycle are represented as values X1<1>, ..., and X1<n>. Similarly, n digital values included in the data A1 of one cycle are represented as values A1<1>, ..., and A1<n>. The values X1<0> and A1<0> correspond to immediately previous symbols of the values X1<1> and A1<1>, respectively. For example, the values X1<0> and A1<0> are the value X1<n> included in the signal X1 and the value A1<n> included in the data A1, respectively, in a CDR loop of an immediately previous cycle. The values X1<0> and A1<0> are stored in advance in a register (not illustrated), for example, in the CDR loop of the immediately previous cycle.

The multiplier 411_1 multiplies the value X1<0> and the value A1<1>. The multiplier 411_1 outputs a value X1<0>A1<1> to the adder 412_1 as a calculation result.

The multiplier 411_2 multiplies the value X1<1> and the value A1<0>. The multiplier 411_2 outputs a value X1<1>A1<0> to the adder 412_1 as a calculation result.

The adder 412_1 subtracts the value X1<1>A1<0> from the value X1<0>A1<1>. The adder 412_1 outputs a value (X1<0>A1<1>−X1<1>A1<0>) to the sign function circuit 413_1 as a calculation result.

The sign function circuit 413_1 determines whether the value (X1<0>A1<1>−X1<1>A1<0>) is positive or negative. When the value (X1<0>A1<1>−X1<1>A1<0>) is positive, the sign function circuit 413_1 outputs "1" to the adder 414. When the value (X1<0>A1<1>−X1<1>A1<0>) is negative, the sign function circuit 413_1 outputs "−1" to the adder 414.

In addition, the multiplier 411_(2k−1) multiplies the value X1<k−1> and the value A1<k>. The multiplier 411_(2k−1) outputs a value X1<k−1>A1<k> to the adder 412_k as a calculation result.

The multiplier 411_2k multiplies the value X1<k> and the value A1<k−1>. The multiplier 411_2k outputs a value X1<k>A1<k−1> to the adder 412_k as a calculation result.

The adder 412_k subtracts the value X1<k>A1<k−1> from the value X1<k−1>A1<k>. The adder 412_k outputs a value (X1<k−1>A1<k>−X1<k>A1<k−1>) to the sign function circuit 413_k as a calculation result.

The sign function circuit 413_k determines whether the value (X1<k−1>A1<k>−X1<k>A1<k−1>) is positive or negative. When the value (X1<k−1>A1<k>−X1<k>A1<k−1>) is positive, the sign function circuit 413_k outputs "1" to the adder 414. When the value (X1<k−1>A1<k>−X1<k>A1<k−1>) is negative, the sign function circuit 413_k outputs "−1" to the adder 414.

The description regarding the multipliers 411_(2k−1) and 411_2k, the adder 412_k, and the sign function circuit 413_k holds for every k that is equal to or more than two and equal to or less than (n−1).

Similarly, the multiplier 411_(2n−1) multiplies the value X1<n−1> and the value A1<n>. The multiplier 411_(2n−1) outputs a value X1<n−1>A1<n> to the adder 412_n as a calculation result.

The multiplier 411_2n multiplies the value X1<n> and the value A1<n−1>. The multiplier 411_2n outputs a value X1<n>A1<n−1> to the adder 412_n as a calculation result.

The adder 412_n subtracts the value X1<n>A1<n−1> from the value X1<n−1>A1<n>. The adder 412_n outputs a value (X1<n−1>A1<n>−X1<n>A1<n−1>) to the sign function circuit 413_n as a calculation result.

The sign function circuit 413_n determines whether the value (X1<n−1>A1<n>−X1<n>A1<n−1>) is positive or negative. When the value (X1<n−1>A1<n>−X1<n>A1<n−1>) is positive, the sign function circuit 413_n outputs "1" to the adder 414. When the value (X1<n−1>A1<n>−X1<n>A1<n−1>) is negative, the sign function circuit 413_n outputs "−1" to the adder 414.

The adder 414 adds "1" or "−1" input from each of the n sign function circuits 413_1 to 413_n. The adder 414 outputs a calculation result to the LF 42 as the value PDOUT.

1.2 Operation

Next, an operation of the receiver device according to the first embodiment will be described.

1.2.1 Receiver Operation

Figure 7:
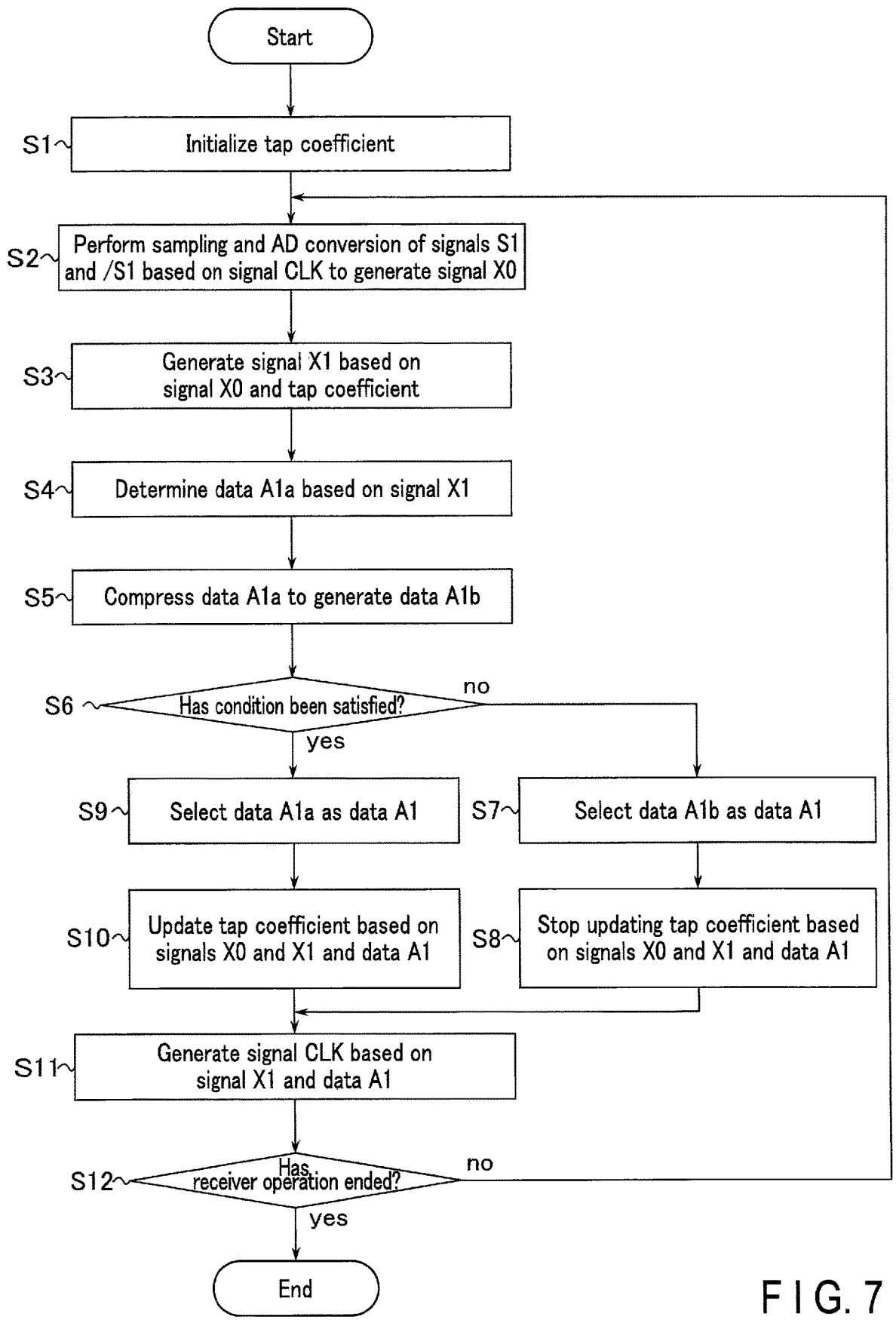
FIG. 7 is a flowchart illustrating an example of a receiver operation in the receiver device according to the first embodiment.

First, a receiver operation in the receiver device according to the first embodiment will be described. FIG. 7 is a flowchart illustrating an example of the receiver operation in the receiver device according to the first embodiment. FIG. 7 illustrates a portion including the CDR loop in the receiver operation.

When reception of the signals S0 and /S0 is started (Start), the tap coefficient update circuit 50 initializes a tap coefficient included in the signal TAP (S1).

Based on the signal CLK, the TI-ADC 20 performs sampling and AD conversion of the signals S1 and /S1 generated based on the signals S0 and /S0 to generate the signal X0 of one cycle (S2).

The FFE 31 of the digital processing circuit 30 generates the signal X1 of one cycle based on the signal X0 of one cycle generated in the processing of S2 and the tap coefficient initialized in the processing of S1 (S3). The signal X1 is output to the CDR 40 and the tap coefficient update circuit 50.

The data comparator 32 of the digital processing circuit 30 determines the data A1a of one cycle based on the signal X1 of one cycle (S4).

The data compressor 33 of the digital processing circuit 30 compresses the data A1a of one cycle to generate the data A1b (S5).

The control circuit 60 determines whether or not a condition has been satisfied (S6). The condition may be, for example, that an elapsed time from the start of reception of the signals S0 and /S0 is equal to or longer than a threshold. The condition may be, for example, that the CDR 40 locks a phase of the signal CLK.

When it is determined that the condition has not been satisfied (S6; no), the control circuit 60 outputs the signal CNT1 including an instruction for selection of the data A1b to the multiplexer 34. The multiplexer 34 selects the data A1b of one cycle generated in the processing of S5 according to the signal CNT1 (S7). The data A1b selected in the processing of S7 is output to the CDR 40 and the tap coefficient update circuit 50 as the data A1.

In addition, when it is determined that the condition has not been satisfied (S6; no), the control circuit 60 outputs the signal CNT2 including an instruction for stop of updating of the tap coefficient to the first update circuit 51 of the tap coefficient update circuit 50. The first update circuit 51 stops updating the tap coefficient based on the signals X0 and X1 and the data A1 (S8) according to the signal CNT2. Here, the stop of updating of the tap coefficient includes not to execute the updating of the tap coefficient.

In this manner, the digital processing circuit 30 operates in the NRZ mode when the condition is not satisfied. That is, the data A1 compressed into 1-bit data is input to the CDR 40 and the tap coefficient update circuit 50 when the condition is not satisfied. Note that the tap coefficient update circuit 50 stops updating the tap coefficient while the data A1 compressed to the 1-bit data is input.

When it is determined that the condition has been satisfied (S6; yes), the control circuit 60 outputs the signal CNT1 including an instruction for selection of the data A1a to the multiplexer 34. The multiplexer 34 selects the data A1a of one cycle generated in the processing of S4 according to the signal CNT1 (S9). The data A1a selected in the processing of S9 is output to the CDR 40 and the tap coefficient update circuit 50 as the data A1.

In addition, when it is determined that the condition has been satisfied (S6; yes), the control circuit 60 outputs the signal CNT2 including an instruction for updating of the tap coefficient to the first update circuit 51 of the tap coefficient update circuit 50. The first update circuit 51 updates the tap coefficient based on the signals X0 and X1 and the data A1 (S10) according to the signal CNT2.

In this manner, the digital processing circuit 30 operates in the PAM4 mode when the condition is satisfied. That is, the data A1 which is 2-bit data is input to the CDR 40 and the tap coefficient update circuit 50 when the condition is satisfied. Then, the tap coefficient update circuit 50 updates the tap coefficient while the data A1 as the 2-bit data is input.

After the processing of S7 and the processing of S8 or after the processing of S9 and the processing of S10, the CDR 40 recovers the signal CLK based on the signal X1 and the data A1 of one cycle (S11).

The host interface circuit 8 determines whether or not the reception of the signals S0 and /S0 has ended based on whether or not the signals S1 and /S1 are input (S12).

When the reception of the signals S0 and /S0 has not ended (S12; no), the TI-ADC 20 generates the signal X0 of a next cycle based on the recovered signal CLK (S2). Accordingly, the processing from S2 to S12 is repeated (the CDR loop) until the reception of the signals S0 and /S0 ends. Note that a current tap coefficient is continuously used in the processing of S3 in the second and subsequent CDR loops in a case where the updating of the tap coefficient is stopped in the processing of S8. Then, in a case where the tap coefficient is updated in the processing of S10, the updated tap coefficient is used.

When the reception of the signals S0 and /S0 has ended (S12; yes), the receiver operation ends (end).

1.3 Effect According to First Embodiment

According to the first embodiment, the TI-ADC 20, the digital processing circuit 30, and the CDR 40 correct the phase shift of the signal CLK by executing the CDR loop. The data comparator 32 of the digital processing circuit 30 determines the 2-bit data A1a per symbol based on the signal X1. The data compressor 33 of the digital processing circuit 30 generates the 1-bit data A1b per symbol based on the data A1a. The control circuit 60 outputs the signal CNT1 indicating selection of any one of the data A1a and the data A1b depending on whether or not the condition has been satisfied. The multiplexer 34 outputs either the data A1a or the data A1b as the data A1 according to the signal CNT1. The PD 41 of the CDR 40 calculates the value PDOUT based on the signal X1 and the data A1. Accordingly, the CDR 40 can selectively use the data A1a based on the PAM4 mode and the data A1b based on the NRZ mode depending on whether or not the condition has been satisfied during the recovery of the signal CLK. Thus, data can be suitably recovered based on a reception signal according to the first embodiment.

Supplementally, when the value PDOUT is positive, the CDR 40 delays the phase of the signal CLK. When the value PDOUT is negative, the CDR 40 advances the phase of the signal CLK. Accordingly, the phase of the signal CLK converges toward a point at which the value PDOUT switches from positive to negative along a direction in which the phase advances as the CDR loop is repeated. This point is referred to as a convergence point. Then, the CDR 40 locks the phase of the signal CLK based on a phase shift amount at the convergence point. However, the CDR 40 is likely to lock the phase of the signal CLK at a wrong convergence point when the digital processing circuit 30 operates in the PAM4 mode.

Figure 8:
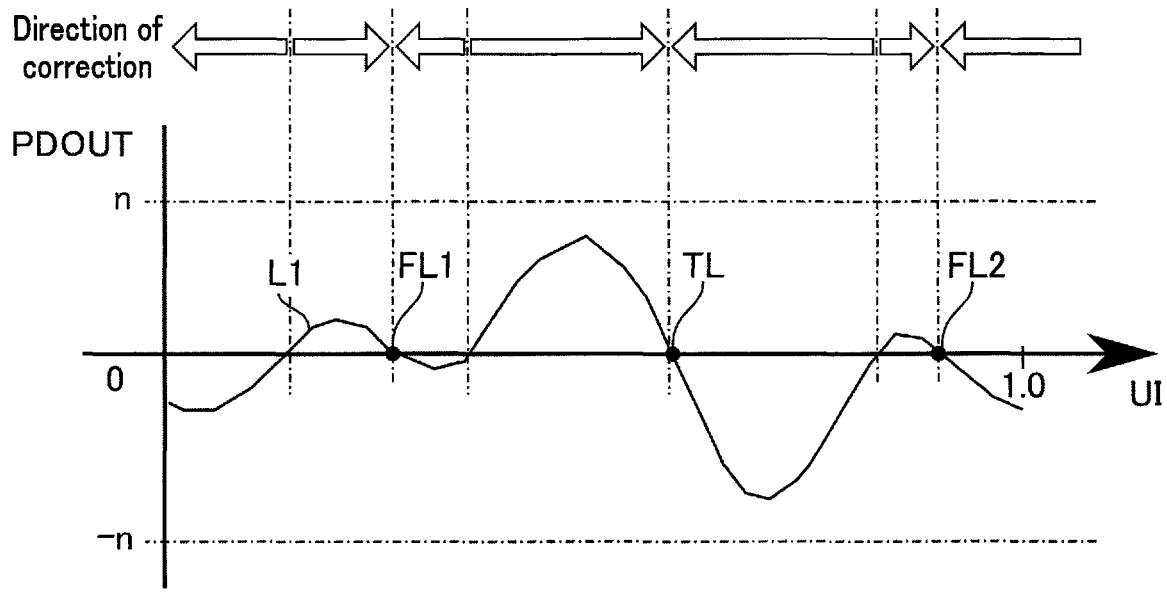
FIG. 8 is a diagram illustrating an example of an output of the phase detector in a PAM4 mode in the receiver device according to the first embodiment.
Figure 9:
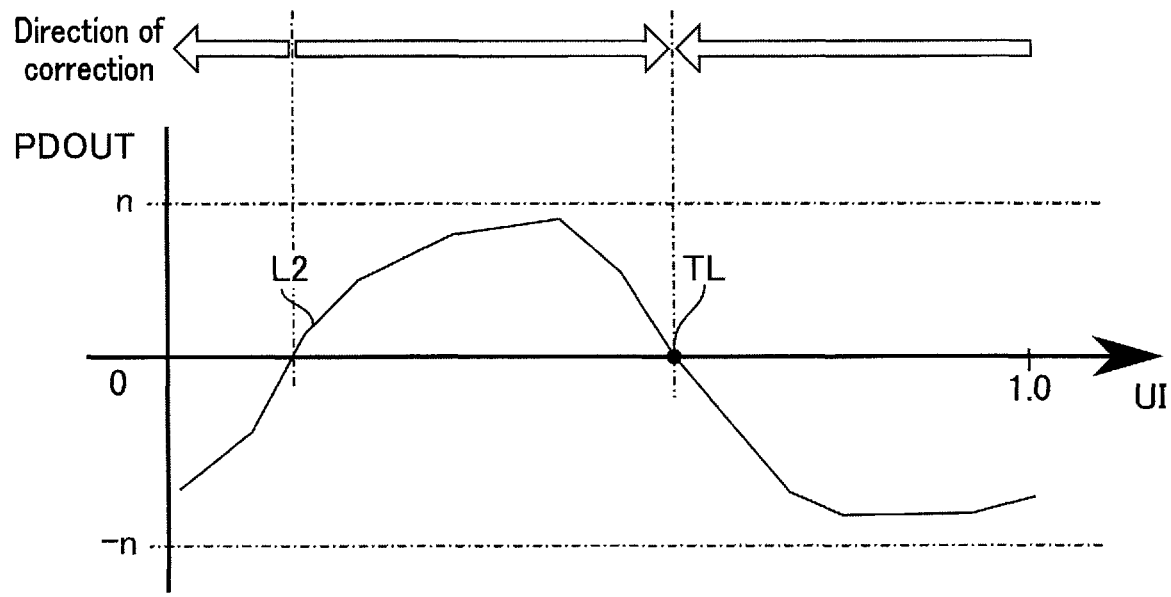
FIG. 9 is a diagram illustrating an example of an output of the phase detector in an NRZ mode in the receiver device according to the first embodiment.

FIG. 8 is a diagram illustrating an example of an output of the phase detector in the PAM4 mode in the receiver device according to the first embodiment. FIG. 9 is a diagram illustrating an example of an output of the phase detector in the NRZ mode in the receiver device according to the first embodiment. In the examples of FIGS. 8 and 9, the value PDOUT, which is the output of the PD 41 of the CDR 40, is indicated on the vertical axis. The horizontal axis indicates a phase shift amount from a sampling timing in a cycle of a certain CDR loop on a unit interval (UI) basis. Here, a range from 0 UI to 1 UI corresponds to one symbol. In addition, examples of a history of the value PDOUT when the phase shift amount from the sampling timing in the cycle of the certain CDR loop is changed from 0 UI to 1 UI are represented by lines L1 and L2 in the examples of FIGS. 8 and 9, respectively.

As illustrated in FIG. 8, when the signal X1 and the data A1a are input to the CDR 40 based on the PAM4 mode, the value PDOUT of the line L1 may have three positive peaks and three negative peaks so as to cross zero multiple times in the range from 0 UI to 1 UI. Thus, the line L1 may have false convergence points FL1 and FL2 each indicating a non-optimum phase shift amount in addition to a true convergence point TL indicating an optimum phase shift amount. That is, in the case of the PAM4 mode, there is at least one or more phases in which the CDR 40 is likely to perform erroneous locking. Therefore, in a case where the CDR 40 locks the phase of the signal CLK using the data A1 (that is, the data A1a) based on the PAM4 mode, there is a possibility that the phase of the signal CLK is locked to the false convergence points FL1 and FL2, which is not preferable.

On the other hand, when the signal X1 and the data A1b are input to the CDR 40 based on the NRZ mode as illustrated in FIG. 9, the value PDOUT of the line L2 may have one positive peak and one negative peak so as to cross zero twice in the range from 0 UI to 1 UI. Thus, the line L2 has only the true convergence point TL and does not have any false convergence point. That is, in the case of the NRZ mode, the possibility that the CDR 40 performs the erroneous locking is lower than that in the case of the PAM4 mode.

Therefore, in a case where the phase of the signal CLK is locked using the data A1 (that is, the data A1b) based on the NRZ mode in the CDR 40, there is a high possibility that the phase of the signal CLK is locked to the true convergence point TL, which is more preferable.

According to the first embodiment, the control circuit 60 causes whether or not the condition is satisfied to correspond to whether or not the CDR 40 has locked the phase of the signal CLK. In one example, the control circuit 60 considers that the condition has been satisfied when the CDR 40 has locked the phase of the signal CLK. In addition, in another example, the control circuit 60 considers that the condition has been satisfied when the elapsed time from the start of reception of the signals S0 and /S0 becomes equal to or longer than the threshold. Accordingly, the multiplexer 34 can switch the data to be output to the CDR 40 between the data A1a and the data A1b depending on whether or not the CDR 40 has locked the phase of the signal CLK.

Specifically, when the condition has not been satisfied, the control circuit 60 outputs the signal CNT1 including the instruction for selection of the data A1b. Accordingly, the CDR 40 can lock the phase of the signal CLK to the true convergence point TL. In addition, when the condition has been satisfied, the control circuit 60 outputs the signal CNT1 including the instruction for selection of the data A1a. Thus, after locking the phase of the signal CLK to the true convergence point TL, the CDR 40 can obtain a larger gain (a change amount d(PDOUT)/d(UI)) by calculating the value PDOUT using the data A1a.

In addition, when the condition has not been satisfied, the control circuit 60 outputs the signal CNT2 including the instruction for the stop of updating of the tap coefficient performed by the first update circuit 51. In addition, when the condition has been satisfied, the control circuit 60 outputs the signal CNT2 including the instruction for updating of the tap coefficient by the first update circuit 51. Accordingly, the first update circuit 51 can prevent the tap coefficient from becoming an inappropriate value by updating the tap coefficient using the data A1b based on the NRZ mode.

2. Second Embodiment

Next, a second embodiment will be described.

The second embodiment is different from the first embodiment in that updating of a tap coefficient is not stopped. Hereinafter, configurations and operations different from those of the first embodiment will be mainly described. The description regarding configurations and operations equivalent to those of the first embodiment will be omitted or simplified as appropriate.

2.1 Configuration of Host Interface Circuit (Receiver Circuit)

FIG. 10 is a block diagram illustrating an example of a configuration of a receiver circuit of a receiver device according to the second embodiment. FIG. 10 corresponds to FIG. 2 in the first embodiment.

A host interface circuit Ba according to the second embodiment includes pads P1 and P2, an analog processing circuit 10, a TI-ADC 20, a digital processing circuit 30a, a CDR 40, a tap coefficient update circuit 50a, and a control circuit 60a. The configuration other than the digital processing circuit 30a, the tap coefficient update circuit 50a, and the control circuit 60a is equivalent to the configuration illustrated in FIG. 2, and thus, the description thereof will be omitted.

The digital processing circuit 30a includes, for example, an FFE, a DFE, and a data comparator. A configuration of the digital processing circuit 30a will be described later. A signal X0 is input to the digital processing circuit 30a. The digital processing circuit 30a performs digital processing on the signal X0 using the FFE, the DFE, and the data comparator. Specifically, the digital processing circuit 30a generates signals X1 and Xf, and data A1a, A1, and Af based on the signal X0. The digital processing circuit 30a outputs the signal X1 and the data A1 to the CDR 40. The digital processing circuit 30a outputs the signals X0 and X1 and the data A1a to the tap coefficient update circuit 50a. The digital processing circuit 30a outputs the signal Xf and the data Af to the tap coefficient update circuit 50a and a subsequent circuit (not illustrated).

The tap coefficient update circuit 50a is an arithmetic circuit. A set of the signals X0 and X1 and the data A1a and a set of the signals X0 and Xf and the data Af are input to the tap coefficient update circuit 50a from the digital processing circuit 30a. The tap coefficient update circuit 50a generates a signal TAP based on the set of the signals X0 and X1 and the data A1a and the set of the signals X0 and Xf and the data Af.

The control circuit 60a includes, for example, a processor, such as a CPU, and a ROM. The control circuit 60a controls the entire host interface circuit 8a. Specifically, for example, the control circuit 60a controls the digital processing circuit 30a based on a signal CNT1.

Figure 11:
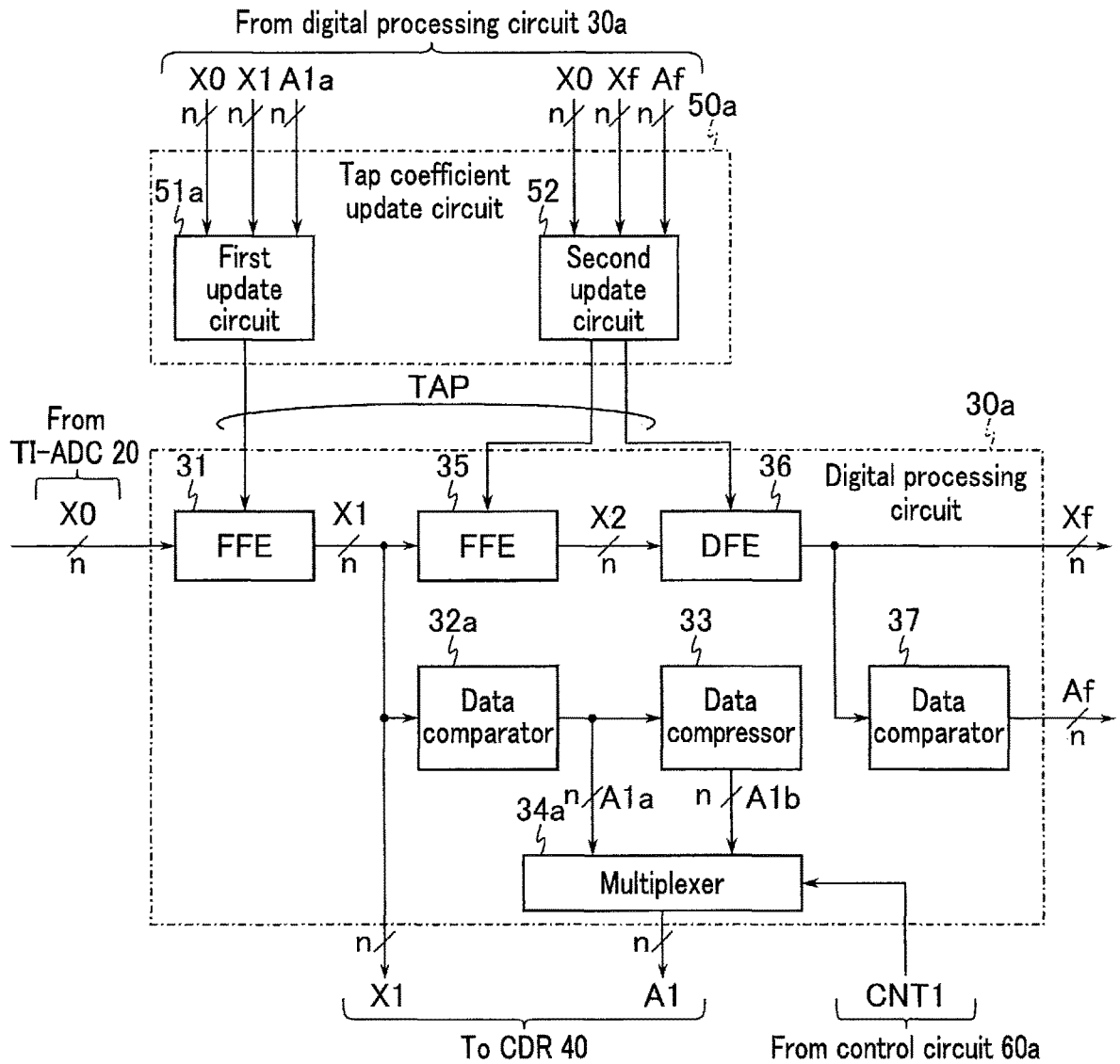
FIG. 11 is a block diagram illustrating an example of configurations of a digital processing circuit and a tap coefficient update circuit of the receiver circuit according to the second embodiment.

2.2 Configurations of Digital Processing Circuit and Tap Coefficient Update Circuit Next, internal configurations of the digital processing circuit and the tap coefficient update circuit of the receiver circuit according to the second embodiment will be described. FIG. 11 is a block diagram illustrating an example of the configurations of the digital processing circuit and the tap coefficient update circuit of the receiver circuit according to the second embodiment. FIG. 11 corresponds to FIG. 3 in the first embodiment.

First, the configuration of the digital processing circuit 30a will be described. The digital processing circuit 30a includes an FFE 31, a data comparator 32a, a data compressor 33, a multiplexer 34a, an FFE 35, a DFE 36, and a data comparator 37. The configuration other than the data comparator 32a and the multiplexer 34a is equivalent to the configuration illustrated in FIG. 3, and thus, the description thereof will be omitted or simplified.

The signal X1 is input to the data comparator 32a. The data comparator 32a determines data encoded by the host device 2 as the data A1a based on the signal X1. Specifically, when PAM4 is applied, the data comparator 32a determines 2-bit data for each of n digital values included in the signal X1 of one cycle. The data comparator 32a outputs the data A1a to the data compressor 33 and the multiplexer 34a. The data A1a is also output to the tap coefficient update circuit 50a.

The data A1a and the data A1b are input to the multiplexer 34a from the data comparator 32a and the data compressor 33, respectively. In addition, the signal CNT1 is input from the control circuit 60a to the multiplexer 34a. The multiplexer 34a outputs any one of the data A1a and the data A1b based on the signal CNT1. The output of the multiplexer 34a is also output to the CDR 40. That is, the multiplexer 34a switches data to be output to the CDR 40 between the data A1a and the data A1b according to the signal CNT1.

Next, the configuration of the tap coefficient update circuit 50a will be described. The tap coefficient update circuit 50a includes a first update circuit 51a and a second update circuit 52. Since the configuration other than the first update circuit 51a is equivalent to the configuration illustrated in FIG. 3, the description thereof will be omitted.

The signal X1 and the data A1a are input to the first update circuit 51a from the FFE 31 and the data comparator 32a, respectively. The signal X0 input to the digital processing circuit 30a is further input to the first update circuit 51a. The first update circuit 51a generates a part of the signal TAP based on the signals X0 and X1 and the data A1a, and outputs the part of the signal TAP to the FFE 31. The part of the signal TAP output from the first update circuit 51a is applied to the FFE 31 as a tap coefficient.

2.3 Receiver Operation

Figure 12:
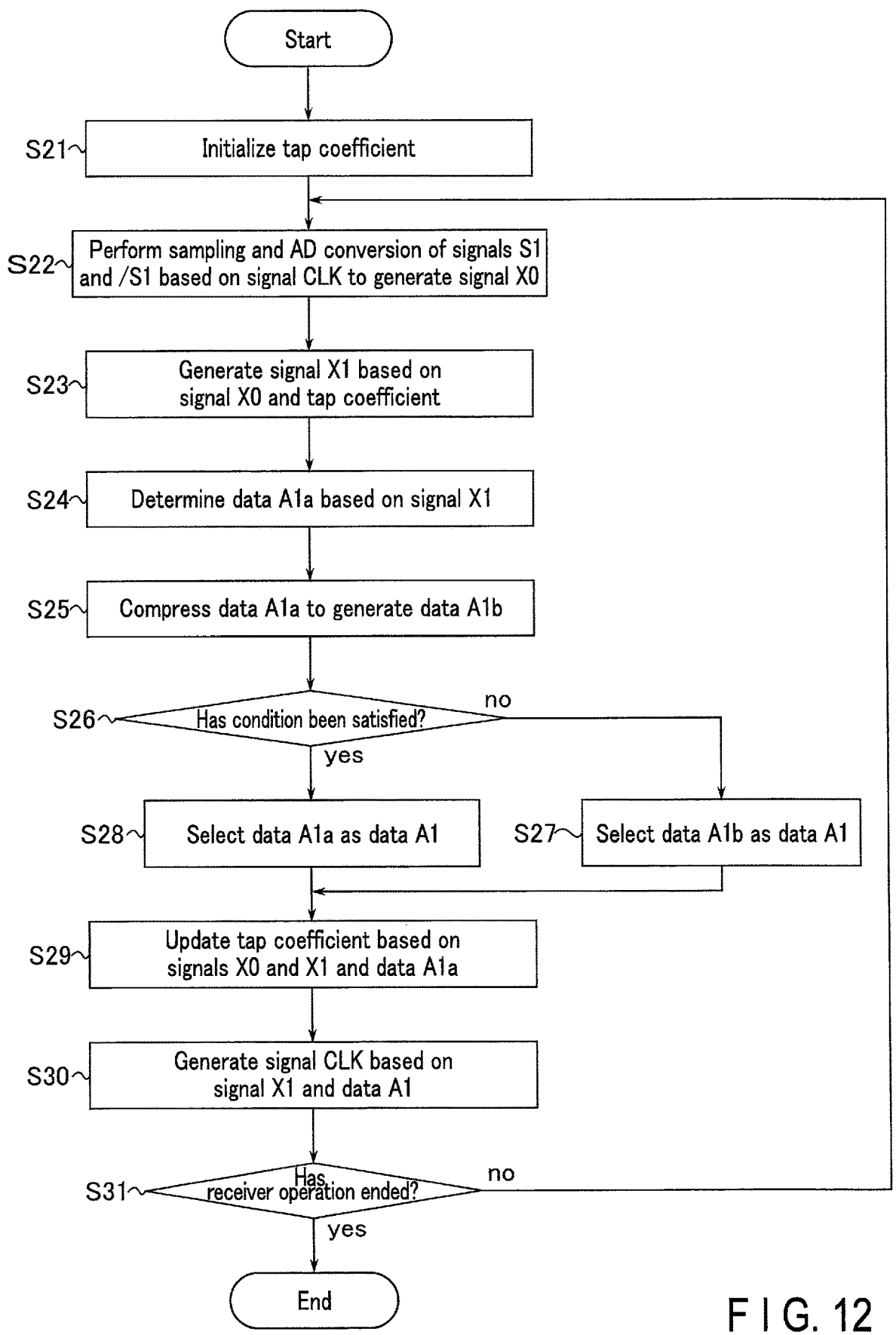
FIG. 12 is a flowchart illustrating an example of a receiver operation in a receiver device according to the second embodiment.

FIG. 12 is a flowchart illustrating an example of a receiver operation in the receiver device according to the second embodiment. FIG. 12 corresponds to FIG. 7 in the first embodiment.

When reception of signals S0 and /S0 is started (Start), the tap coefficient update circuit 50a initializes a tap coefficient included in the signal TAP (S21).

The TI-ADC 20 performs sampling and AD conversion of signals S1 and /S1 generated based on the signals S0 and /S0 based on a signal CLK to generate the signal X0 of one cycle (S22).

The FFE 31 of the digital processing circuit 30a generates the signal X1 of one cycle based on the signal X0 of one cycle generated in the processing of S22 and the tap coefficient initialized in the processing of S21 (S23). The signal X1 is output to the CDR 40 and the tap coefficient update circuit 50a.

The data comparator 32a of the digital processing circuit 30a determines the data A1a of one cycle based on the signal X1 of one cycle (S24).

The data compressor 33 of the digital processing circuit 30a compresses the data A1a of one cycle to generate the data A1b (S25).

The control circuit 60a determines whether or not a condition has been satisfied (S26). The condition may be, for example, that an elapsed time from the start of reception of the signals S0 and /S0 is equal to or longer than a threshold. The condition may be, for example, that the CDR 40 locks a phase of the signal CLK.

When it is determined that the condition has not been satisfied (S26; no), the control circuit 60a outputs the signal CNT1 including an instruction for selection of the data A1b to the multiplexer 34a. The multiplexer 34a selects the data A1b of one cycle generated in the processing of S25 according to the signal CNT1 (S27). The data A1b selected in the processing of S27 is output to the CDR 40 as the data A1. In this manner, the digital processing circuit 30a operates in an NRZ mode when the condition is not satisfied. That is, the data A1 compressed into 1-bit data is input to the CDR 40 when the condition is not satisfied.

When it is determined that the condition has been satisfied (S26; yes), the control circuit 60a outputs the signal CNT1 including an instruction for selection of the data A1a to the multiplexer 34a. The multiplexer 34a selects the data A1a of one cycle generated in the processing of S24 according to the signal CNT1 (S28). The data A1a selected in the processing of S28 is output to the CDR 40 as the data A1. In this manner, the digital processing circuit 30a operates in a PAM4 mode when the condition is satisfied. That is, the data A1 which is 2-bit data is input to the CDR 40 when the condition is satisfied.

Note that the signals X0 and X1 and the data A1a are input to the first update circuit 51a regardless of whether or not the condition has been satisfied. Thus, the first update circuit 51a updates the tap coefficient based on the signals X0 and X1 and the data A1a regardless of whether or not the condition has been satisfied (S29).

The CDR 40 recovers the signal CLK based on the signal X1 and the data A1 of one cycle (S30).

The host interface circuit 8a determines whether or not the reception of the signals S0 and /S0 has ended based on whether or not the signals S1 and /S1 are input (S31).

When the reception of the signals S0 and /S0 has not ended (S31; no), the TI-ADC 20 generates the signal X0 of the next cycle based on the recovered signal CLK (S22). Accordingly, the processing from S22 to S31 is repeated (a CDR loop) until the reception of the signals S0 and /S0 ends. Note that the tap coefficient updated in the processing of S29 is used in the processing of S23 in the second and subsequent CDR loops.

When the reception of the signals S0 and /S0 has ended (S31; yes), the receiver operation ends (end).

2.4 Effect According to Second Embodiment

According to the second embodiment, the signals X0 and X1 and the data A1a are input to the first update circuit 51a regardless of whether or not the condition is satisfied. Accordingly, the first update circuit 51a can update the tap coefficient even in a state where the phase of the signal CLK is not locked or in the middle of the locking operation. Thus, the first update circuit 51a can continue to update the tap coefficient regardless of whether the digital processing circuit 30a operates in the PAM4 mode or the NRZ mode.

3. Third Embodiment

Next, a third embodiment will be described.

The third embodiment is different from the first and second embodiments in that data A1b based on an NRZ mode is not generated. Hereinafter, configurations and operations different from those of the first embodiment and the second embodiment will be mainly described. The description regarding configurations and operations equivalent to those of the first embodiment and the second embodiment will be omitted or simplified as appropriate.

3.1 Configuration of Host Interface Circuit (Receiver Circuit)

FIG. 13 is a block diagram illustrating an example of a configuration of a receiver circuit of a receiver device according to the third embodiment. FIG. 13 corresponds to FIG. 2 in the first embodiment.

A host interface circuit 8b according to the third embodiment includes pads P1 and P2, an analog processing circuit 10, a TI-ADC 20, a digital processing circuit 30b, a CDR 40b, a tap coefficient update circuit 50b, and a control circuit 60b. The configuration other than the digital processing circuit 30b, the CDR 40b, the tap coefficient update circuit 50b, and the control circuit 60b is equivalent to the configuration illustrated in FIG. 2, and thus, the description thereof will be omitted.

The digital processing circuit 30b includes, for example, an FFE, a DFE, and a data comparator. A configuration of the digital processing circuit 30b will be described later. A signal X0 is input to the digital processing circuit 30b. The digital processing circuit 30b performs digital processing on the signal X0 using the FFE, the DFE, and the data comparator. Specifically, the digital processing circuit 30b generates signals X1 and Xf, and data A1_1, A1_2, A1a, and Af based on the signal X0. The digital processing circuit 30b outputs the signal X1, the data A1_1, and the data A1_2 to the CDR 40b. The digital processing circuit 30b outputs the signals X0 and X1 and the data A1a to the tap coefficient update circuit 50b. The digital processing circuit 30b outputs the signal Xf and the data Af to the tap coefficient update circuit 50b and a subsequent circuit (not illustrated). Details of the data A1_1 and the data A1_2 will be described later.

The CDR 40b is a clock data recovery circuit. The signal X1, and the data A1_1 and A1_2 are input to the CDR 40b every cycle. The CDR 40b calculates a phase correction amount of a signal CLK based on the signal X1, and the data A1_1 and A1_2. The CDR 40b recovers the signal CLK based on the calculated phase correction amount. The CDR 40b outputs the recovered signal CLK to the TI-ADC 20 every cycle. In this manner, based on the signal X1, and the data A1_1 and A1_2, which are generated from the signal X0 of one cycle, the CDR 40b recovers the signal CLK serving as a reference of a sampling timing of the signal X0 of the subsequent one cycle.

The tap coefficient update circuit 50b is an arithmetic circuit. A set of the signals X0 and X1 and the data A1a and a set of the signals X0 and Xf and the data Af are input to the tap coefficient update circuit 50b from the digital processing circuit 30b. The tap coefficient update circuit 50b generates a signal TAP based on the set of the signals X0 and X1 and the data A1a and the set of the signals X0 and Xf and the data Af.

The control circuit 60b includes, for example, a processor, such as a CPU, and a ROM. The control circuit 60b controls the entire host interface circuit 8b. Specifically, for example, the control circuit 60b controls the digital processing circuit 30b based on a signal CNT3. The signal CNT3 is a signal for controlling values of the data A1_1 and A1_2 which are output from the digital processing circuit 30b.

Figure 14:
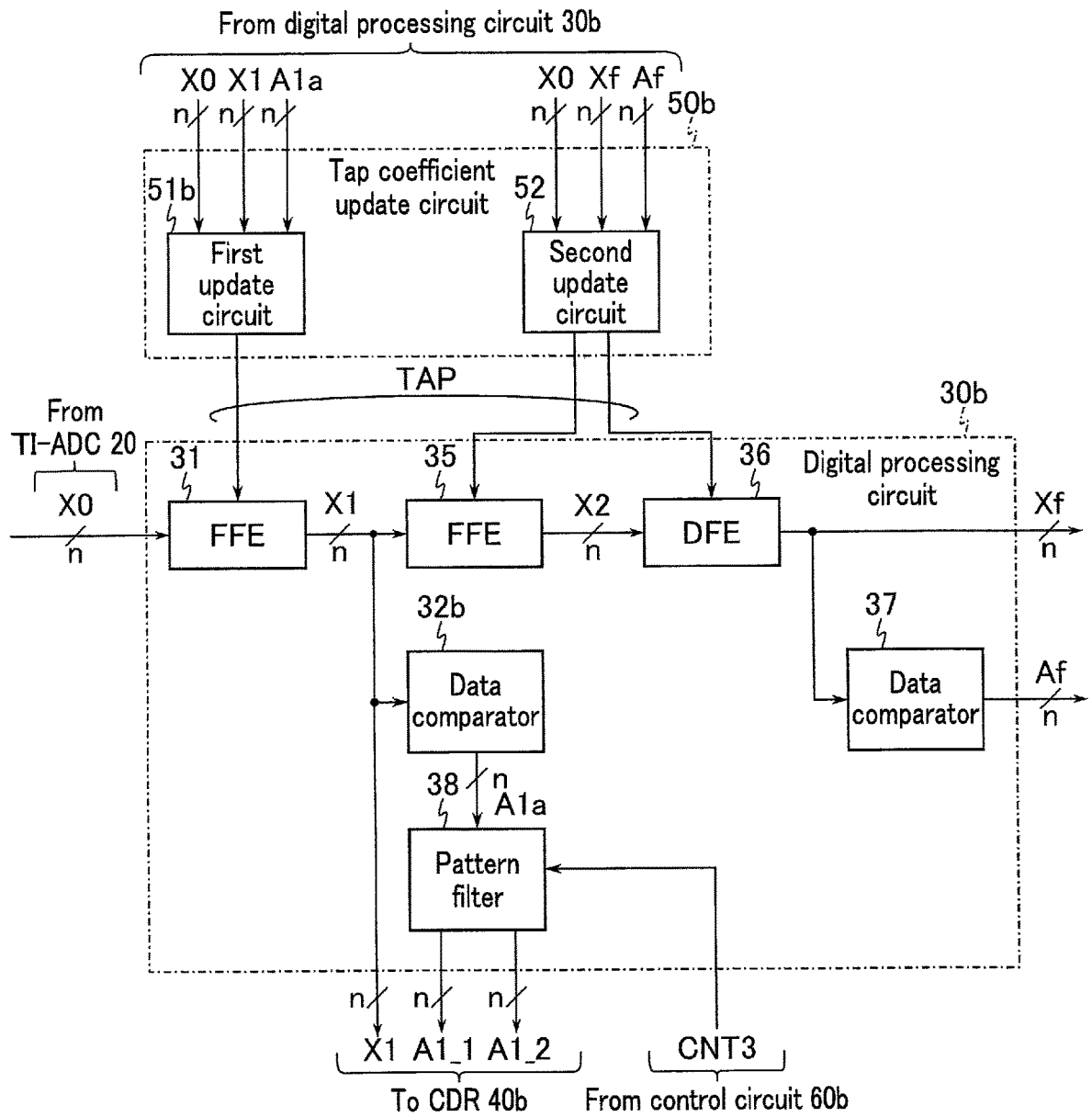
FIG. 14 is a block diagram illustrating an example of configurations of a digital processing circuit and a tap coefficient update circuit of the receiver circuit according to the third embodiment.

3.2 Configurations of Digital Processing Circuit and Tap Coefficient Update Circuit Next, internal configurations of the digital processing circuit and the tap coefficient update circuit of the receiver circuit according to the third embodiment will be described. FIG. 14 is a block diagram illustrating an example of the configurations of the digital processing circuit and the tap coefficient update circuit of the receiver circuit according to the third embodiment. FIG. 14 corresponds to FIG. 3 in the first embodiment.

First, the configuration of the digital processing circuit 30b will be described. The digital processing circuit 30b includes an FFE 31, a data comparator 32b, an FFE 35, a DFE 36, a data comparator 37, and a pattern filter 38. The configuration other than the data comparator 32b and the pattern filter 38 is equivalent to the configuration illustrated in FIG. 3, and thus, the description thereof will be omitted or simplified.

The signal X1 is input to the data comparator 32b. The data comparator 32b determines data encoded by the host device 2 as the data A1a based on the signal X1. Specifically, when PAM4 is applied, the data comparator 32b determines 2-bit data for each of n digital values included in the signal X1 of one cycle. The data comparator 32b outputs the data A1a to the pattern filter 38. The data A1a is also output to the tap coefficient update circuit 50b.

The data A1a is input to the pattern filter 38 from the data comparator 32b. The pattern filter 38 is a circuit that generates the data A1_1 and A1_2 based on the data A1a. The pattern filter 38 outputs the generated data A1_1 and A1_2 to the CDR 40b. In addition, the signal CNT3 is input to the pattern filter 38 from the control circuit 60b. The pattern filter 38 is turned into either an active state or an inactive state according to the signal CNT3. The pattern filter 38 in the active state generates the data A1_1 and A1_2 by filtering the data A1a with a predetermined pattern. The generated data A1_1 and A1_2 are output to the CDR 40b. The pattern filter 38 in the inactive state copies the data A1a to the data A1_1 and A1_2 without performing filtering. The data A1_1 and A1_2 obtained by copying the data A1a are output to the CDR 40b.

Figures 15, 16, 17:
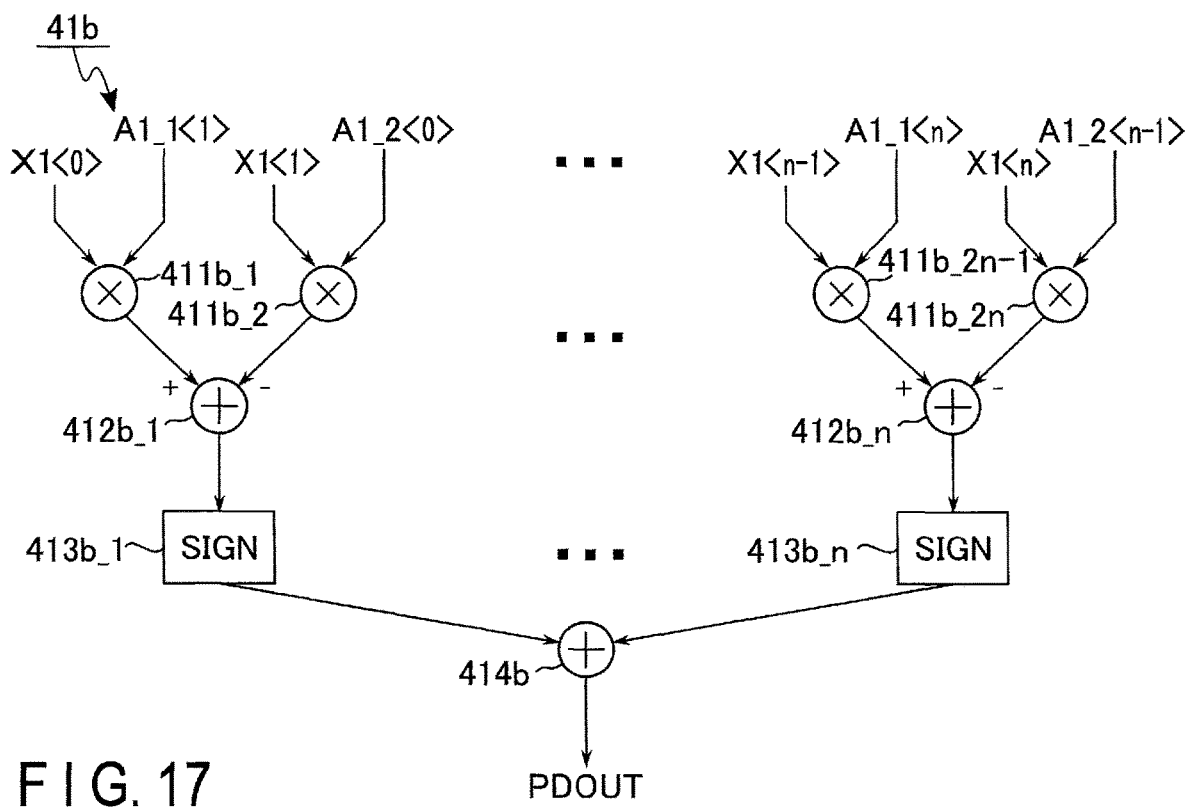
FIG. 15 is a diagram illustrating an example of a functional configuration of a pattern filter in an inactive state of the digital processing circuit according to the third embodiment.
FIG. 16 is a diagram illustrating an example of a functional configuration of the pattern filter in an active state of the digital processing circuit according to the third embodiment.
FIG. 17 is a block diagram illustrating an example of a configuration of a phase detector of a clock data recovery circuit according to the third embodiment.

FIG. 15 is a diagram illustrating an example of a functional configuration of the pattern filter in the inactive state of the digital processing circuit according to the third embodiment. FIG. 16 is a diagram illustrating an example of a functional configuration of the pattern filter in the active state of the digital processing circuit according to the third embodiment. Each of FIGS. 15 and 16 illustrates a relationship between values A1a$<i>$ and A1a$<i+1>$ included in the data A1a and values A1_2$<i>$ and A1_1$<i+1>$ included in the data A1_2 and A1_1. The values A1a$<i>$ and A1a$<i+1>$ are digital values corresponding to two symbols which are included in the data A1a and temporally adjacent to each other. The value A1_2$<i>$ is a digital value corresponding to the data A1a$<i>$ in the data A1_2. The value A1_1$<i+1>$ is a digital value corresponding to the data A1a$<i+1>$ in the data A1_1.

First, the data A1_1 and the data A1_2 output from the pattern filter 38 in the inactive state will be described with reference to FIG. 15.

As illustrated in FIG. 15, the pattern filter 38 copies the values A1a$<i>$ and A1a$<i+1>$ to the values A1_2$<i>$ and A1_1$<i+1>$, respectively. Accordingly, both the data A1_1 and the data A1_2 become data substantially equivalent to the data A1a.

Next, the data A1_1 and the data A1_2 output from the pattern filter 38 in the active state will be described with reference to FIG. 16.

As illustrated in FIG. 16, when the value A1a$<i>$ indicates "−3" and the value A1a$<i+1>$ indicates "−3", "−1", or "+1", the pattern filter 38 outputs the value A1_2$<i>$ indicating "0" and the value A1_1$<i+1>$ indicating "0". When the value A1a$<i>$ indicates "−3" and the value A1a$<i+1>$ indicates "+3", the pattern filter 38 outputs the value A1_2$<i>$ indicating "−3" and the value A1_1$<i+1>$ indicating "+3". When the value A1a$<i>$ indicates "−1" or "+1", the pattern filter 38 outputs the value A1_2$<i>$ indicating "0" and the value A1_1$<i+1>$ indicating "0". When the value A1a$<i>$ indicates "+3" and the value A1a$<i+1>$ indicates "−1", "+1", or "+3", the pattern filter 38 outputs the value A1_2$<i>$ indicating "0" and the value A1_1$<i+1>$ indicating "0". When the value A1a$<i>$ indicates "+3" and the value A1a$<i+1>$ indicates "−3", the pattern filter 38 outputs the value A1_2$<i>$ indicating "+3" and the value A1_1$<i+1>$ indicating "−3". In this manner, the pattern filter 38 in the active state selectively extracts a transition from "−3" to "+3" and a transition from "+3" to "−3" among transitions between temporally adjacent symbols included in the data A1a.

Returning to FIG. 14 again, the configuration of the tap coefficient update circuit 50b will be described. The tap coefficient update circuit 50b includes a first update circuit 51b and a second update circuit 52. Since the configuration other than the first update circuit 51b is equivalent to the configuration illustrated in FIG. 3, the description thereof will be omitted.

The signal X1 and the data A1a are input to the first update circuit 51b from the FFE 31 and the data comparator 32b, respectively. The signal X0 input to the digital processing circuit 30b is further input to the first update circuit 51b. The first update circuit 51b generates a part of the signal TAP based on the signals X0 and X1 and the data A1a, and outputs the part of the signal TAP to the FFE 31. The part of the signal TAP output from the first update circuit 51b is applied to the FFE 31 as a tap coefficient.

3.3 Configuration of Phase Detector

Next, an internal configuration of a phase detector (PD) of the clock data recovery circuit according to the third embodiment will be described. FIG. 17 is a block diagram illustrating an example of the configuration of the phase detector of the clock data recovery circuit according to the third embodiment. FIG. 17 corresponds to FIG. 6 in the first embodiment. The CDR 40b according to the third embodiment includes a PD 41b instead of the PD 41 illustrated in FIG. 5 in the first embodiment.

Values X1<0> and A1_2<0> correspond to immediately previous symbols of values X1<1> and A1_2<1>, respectively. For example, the values X1<0> and A1_2<0> are a value X1<n> included in the signal X1 and a value A1_2<n> included in the data A1_2, respectively, in a CDR loop of an immediately previous cycle. The values X1<0> and A1_2<0> are stored in advance in a register (not illustrated), for example, in the CDR loop of the immediately previous cycle.

The PD 41b includes a plurality of multipliers 411b, a plurality of adders 412b, a plurality of sign function circuits 413b, and an adder 414b. The plurality of multipliers 411b includes 2n multipliers 411b_1, 411b_2, . . . , 411b_(2k−1) (not illustrated), 411b_2k (not illustrated), . . . , 411b_(2n−1), and 411b_2n. The plurality of adders 412b includes n adders 412b_1, . . . , 412b_k (not illustrated), . . . , and 412b_n. The plurality of sign function circuits 413b includes n sign function circuits 413b_1, . . . , 413b_k (not illustrated), . . . , and 413b_n.

The multiplier 411b_1 multiplies the value X1<0> and a value A1_1<1>. The multiplier 411b_1 outputs a value X1<0>A1_1<1> to the adder 412b_1 as a calculation result.

The multiplier 411b_2 multiplies a value X1<1> and the value A1_2<0>. The multiplier 411b_2 outputs a value X1<1>A1_2<0> to the adder 412b_1 as a calculation result.

The adder 412b_1 subtracts the value X1<1>A1_2<0> from the value X1<0>A1_1<1>. The adder 412b_1 outputs a value (X1<0>A1_1<1>−X1<1>A1_2<0>) to the sign function circuit 413b_1 as a calculation result.

The sign function circuit 413b_1 determines whether the value (X1<0>A1_1<1>−X1<1>A1_2<0>) is positive or negative. When the value (X1<0>A1_1<1>−X1<1>A1_2<0>) is positive, the sign function circuit 413b_1 outputs "1" to the adder 414b. When the value (X1<0>A1_1<1>−X1<1>A1_2<0>) is negative, the sign function circuit 413b_1 outputs "−1" to the adder 414b. When the value (X1<0>A1_1<1>−X1<1>A1_2<0>) is "0", the sign function circuit 413b_1 outputs "0" to the adder 414b.

In addition, the multiplier 411b_(2k−1) multiplies a value X1<k−1> and a value A1_1<k>. The multiplier 411b_(2k−1) outputs a value X1<k−1>A1_1<k> to the adder 412b_k as a calculation result.

The multiplier 411b_2k multiplies a value X1<k> and a value A1_2<k−1>. The multiplier 411b_2k outputs a value X1<k>A1_2<k−1> to the adder 412b_k as a calculation result.

The adder 412b_k subtracts the value X1<k>A1_2<k−1> from the value X1<k−1>A1_1<k>. The adder 412b_k outputs a value (X1<k−1>A1_1<k>−X1<k>A1_2<k−1>) to the sign function circuit 413b_k as a calculation result.

The sign function circuit 413b_k determines whether the value (X1<k−1>A1_1<k>−X1<k>A1_2<k−1>) is positive or negative. When the value (X1<k−1>A1_1<k>−X1<k>A1_2<k−1>) is positive, the sign function circuit 413b_k outputs "1" to the adder 414b. When the value (X1<k−1>A1_1<k>−X1<k>A1_2<k−1>) is negative, the sign function circuit 413b_k outputs "−1" to the adder 414b. When the value (X1<k−1>A1_1<k>−X1<k>A1_2<k−1>) is "0", the sign function circuit 413b_k outputs "0" to the adder 414b.

The description regarding the multipliers 411b_(2k−1) and 411b_2k, the adder 412b_k, and the sign function circuit 413b_k holds for every k that is equal to or more than two and equal to or less than (n−1).

Similarly, the multiplier 411b_(2n−1) multiplies the value X1<n−1> and a value A1_1<n>. The multiplier 411b_(2n−1) outputs a value X1<n−1>A1_1<n> to the adder 412b_n as a calculation result.

The multiplier 411b_2n multiplies the value X1<n> and a value A1_2<n−1>. The multiplier 411b_2n outputs a value X1<n>A1_2<n−1> to the adder 412b_n as a calculation result.

The adder 412b_n subtracts the value X1<n>A1_2<n−1> from the value X1<n−1>A1_1<n>. The adder 412b_n outputs a value (X1<n−1>A1_1<n>−X1<n>A1_2<n−1>) to the sign function circuit 413b_n as a calculation result.

The sign function circuit 413b_n determines whether the value (X1<n−1>A1_1<n>−X1<n>A1_2<n−1>) is positive or negative. When the value (X1<n−1>A1_1<n>−X1<n>A1_2<n−1>) is positive, the sign function circuit 413b_n outputs "1" to the adder 414b. When the value (X1<n−1>A1_1<n>−X1<n>A1_2<n−1>) is negative, the sign function circuit 413b_n outputs "−1" to the adder 414b. When the value (X1<n−1>A1_1<n>−X1<n>A1_2<n−1>) is "0", the sign function circuit 413b_n outputs "0" to the adder 414b.

The adder 414b adds "1" or "−1" input from each of the n sign function circuits 413b_1 to 413b_n. The adder 414b outputs a calculation result to an LF 42 as a value PDOUT.

With the above configuration, when the pattern filter 38 is in the active state, the output from the corresponding sign function circuit 413b is "0" except for the cases where a value of the data A1a transitions from "−3" to "+3" and transitions from "+3" to "−3" between temporally adjacent symbols.

3.4 Receiver Operation

Figure 18:
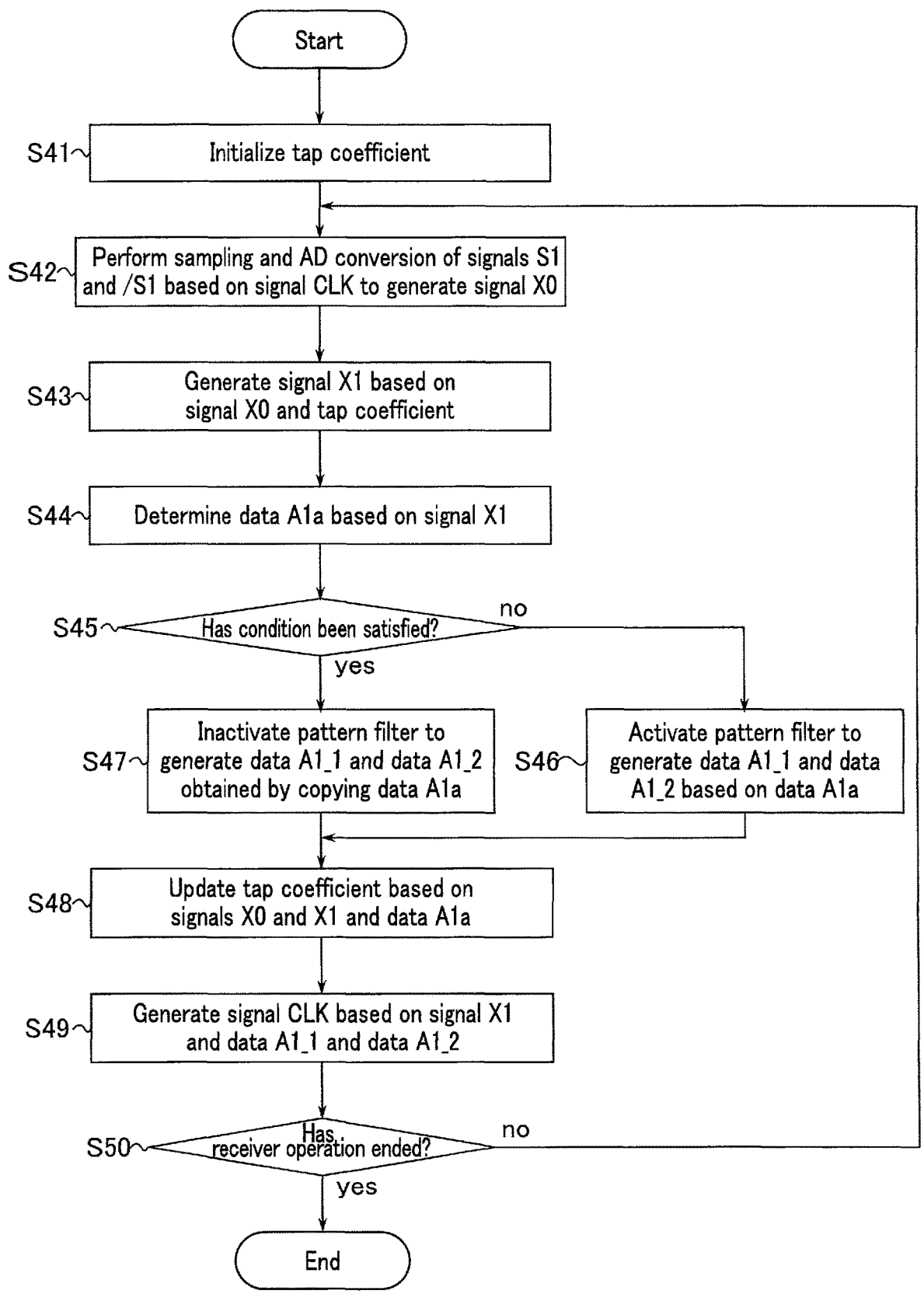
FIG. 18 is a flowchart illustrating an example of a receiver operation in a receiver device according to the third embodiment.

FIG. 18 is a flowchart illustrating an example of a receiver operation in the receiver device according to the third embodiment. FIG. 18 corresponds to FIG. 7 in the first embodiment.

When reception of signals S0 and /S0 is started (Start), the tap coefficient update circuit 50b initializes a tap coefficient included in the signal TAP (S41).

The TI-ADC 20 performs sampling and AD conversion of signals S1 and /S1 generated based on the signals S0 and /S0 based on the signal CLK to generate the signal X0 of one cycle (S42).

The FFE 31 of the digital processing circuit 30b generates the signal X1 of one cycle based on the signal X0 of one cycle generated in the processing of S42 and the tap coefficient initialized in the processing of S41 (S43). The signal X1 is output to the CDR 40b and the tap coefficient update circuit 50b.

The data comparator 32b of the digital processing circuit 30b determines the data A1a of one cycle based on the signal X1 of one cycle (S44).

The control circuit 60b determines whether or not a condition has been satisfied (S45). The condition may be, for example, that an elapsed time from the start of reception of the signals S0 and /S0 is equal to or longer than a threshold. The condition may be, for example, that the CDR 40*b* locks a phase of the signal CLK.

When it is determined that the condition has not been satisfied (S45; no), the control circuit 60*b* outputs the signal CNT3 for turning the pattern filter 38 into the active state to the pattern filter 38. The pattern filter 38 is turned into the active state according to the signal CNT3. The pattern filter 38 in the active state generates the data A1_1 and the data A1_2 based on the data A1*a* (S46). The data A1_1 and the data A1_2 generated in the processing of S46 are output to the CDR 40*b*. In this manner, when the condition is not satisfied, pieces of information regarding the transition from "−3" to "+3" and the transition from "+3" to "−3" among the transitions of data in the PAM4 mode are selectively included in the data A1_1 and the data A1_2 output to the CDR 40*b*.

When it is determined that the condition has been satisfied (S45; yes), the control circuit 60*b* outputs the signal CNT3 for turning the pattern filter 38 into the inactive state to the pattern filter 38. The pattern filter 38 is turned into the inactive state according to the signal CNT3. The pattern filter 38 in the inactive state generates the data A1_1 and the data A1_2 obtained by copying the data A1*a* (S47). The data A1_1 and the data A1_2 generated in the processing of S47 are output to the CDR 40*b*. In this manner, when the condition is satisfied, all pieces of information regarding the transitions of data in the PAM4 mode are included in the data A1_1 and the data A1_2 output to the CDR 40*b*.

Note that the signals X0 and X1 and the data A1*a* are input to the first update circuit 51*b* regardless of whether or not the condition has been satisfied. Thus, the first update circuit 51*b* updates the tap coefficient based on the signals X0 and X1 and the data A1*a* regardless of whether or not the condition has been satisfied (S48).

The CDR 40*b* recovers the signal CLK based on the signal X1, the data A1_1, and the data A1_2 of one cycle (S49).

The host interface circuit 8*b* determines whether or not the reception of the signals S0 and /S0 has ended based on whether or not the signals S1 and /S1 are input (S50).

When the reception of the signals S0 and /S0 has not ended (S50; no), the TI-ADC 20 generates the signal X0 of the next cycle based on the recovered signal CLK (S42). Accordingly, the processing from S42 to S50 is repeated (a CDR loop) until the reception of the signals S0 and /S0 ends. Note that the tap coefficient updated in the processing of S48 is used in the processing of S43 in the second and subsequent CDR loops.

When the reception of the signals S0 and /S0 has ended (S50; yes), the receiver operation ends (end).

3.5 Effect According to Third Embodiment

According to the third embodiment, the control circuit 60*b* outputs the signal CNT3 including an instruction for whether or not to activate the pattern filter 38 depending on whether or not the condition has been satisfied. The pattern filter 38 in the active state outputs the data A1_1 and the data A1_2, obtained by filtering the data A1*a*, to the CDR 40*b* according to the transition of bit data between symbols. The pattern filter 38 in the inactive state outputs the data A1_1 and the data A1_2, substantially equivalent to the data A1*a*, to the CDR 40*b*. Accordingly, the CDR 40*b* can selectively use the data A1*a* based on the PAM4 mode and the filtered data A1_1 and data A1_2 depending on whether or not the condition has been satisfied during the recovery of the signal CLK.

Specifically, the value A1_2<$i$> of the data A1_2 and the value A1_1<$i$+1> of the data A1_1 output by the pattern filter 38 in the active state are both "0" except for the case where the transition from the value A1*a*<$i$> to the value A1*a*<$i$+1> is from "−3" to "+3" or from "+3" to "−3". The value A1_2<$i$> of the data A1_2 and the value A1_1<$i$+1> of the data A1_1 output by the pattern filter 38 in the active state are equal to the values A1*a*<$i$> and A1*a*<$i$+1>, respectively, in the case where the transition from the value A1*a*<$i$> to the value A1*a*<$i$+1> is from "−3" to "+3" or from "+3" to "−3". Accordingly, the output of the corresponding sign function circuit 413*b*_i can be set to "0" except for the case where the transition from the value A1*a*<$i$> to the value A1*a*<$i$+1> is from "−3" to "+3" or from "+3" to "−3". Thus, the PD 41*b* can prevent the value PDOUT from reflecting all transition patterns different from a transition pattern in the NRZ mode (that is, the transition from "−3" to "+3" or from "+3" to "−3") in a state where the phase of the signal CLK is not locked or in the middle of the locking operation. Therefore, the same effects as those of the first embodiment and the second embodiment can be obtained.

4. Modified Examples Etc

Note that the first embodiment, the second embodiment, and the third embodiment are not limited to the above-described examples, and various modifications can be applied.

Although a case where the data compressors 33 and 33*a* generate the data A1*b* having 1-bit data per symbol has been described in the first embodiment and the second embodiment described above, but the present invention is not limited thereto. In a case where the data A1*a* has data of three or more bits per symbol, the data compressors 33 and 33*a* may generate, as the data A1*b*, data having data of a smaller number of bits than bit data included in the data A1*a* per symbol.

In addition, the host interface circuit has been described as an example of the receiver circuit in the first embodiment, the second embodiment, and the third embodiment described above, but the present invention is not limited thereto. For example, the receiver circuit may be a semiconductor integrated circuit used for serial communication.

Although several embodiments of the present invention have been described, these embodiments have been presented as examples, and are not intended to limit the scope of the invention. These novel embodiments can be implemented in various other forms, and various omissions, substitutions, and changes can be made within the scope not departing from the gist of the invention. These embodiments and modifications thereof are included in the scope and gist of the invention, and are included in the invention described in the claims and the equivalent scope thereof.

What is claimed is:

1. A semiconductor integrated circuit comprising:
   a converter configured to convert an analog signal into a digital signal based on a clock signal;
   a comparator configured to determine first data having data of a first number of bits per symbol and second data having data of a second number of bits, less than the first number, per symbol based on the digital signal;
   a recovery circuit configured to recover the clock signal; and
   a control circuit configured to input the digital signal and the first data to the recovery circuit in a case where a condition is not satisfied, and to input the digital signal and the second data to the recovery circuit in a case where the condition is satisfied.

2. The semiconductor integrated circuit according to claim 1, wherein
the case where the condition is satisfied includes a case where an elapsed time from a start of reception of the analog signal is equal to or longer than a threshold, or a case where a phase of the clock signal recovered by the recovery circuit has been locked.

3. The semiconductor integrated circuit according to claim 1, further comprising
an update circuit configured to update a tap coefficient that is used for an arithmetic operation on the digital signal,
wherein the control circuit is configured to stop updating of the tap coefficient performed by the update circuit in the case where the condition is not satisfied, and to update the tap coefficient by the update circuit in the case where the condition is satisfied.

4. The semiconductor integrated circuit according to claim 1, further comprising
an update circuit configured to update a tap coefficient that is used for an arithmetic operation on the digital signal regardless of whether or not the condition is satisfied.

5. The semiconductor integrated circuit according to claim 1, wherein
the first data has 2-bit data per symbol, and
the second data has 1-bit data per symbol.

6. The semiconductor integrated circuit according to claim 1, wherein
the recovery circuit includes a phase detector configured to calculate a first value related to a phase of the clock signal based on the digital signal and the first data or the second data,
the digital signal has a second value sampled at a first timing and a third value sampled at a second timing different from the first timing,
the first data has a fourth value corresponding to the second value and a fifth value corresponding to the third value,
the second data has a sixth value corresponding to the second value and a seventh value corresponding to the third value, and
the phase detector is configured to calculate the first value based on a difference between a product of the second value and the fifth value and a product of the third value and the fourth value or a difference between a product of the second value and the seventh value and a product of the third value and the sixth value.

7. The semiconductor integrated circuit according to claim 6, wherein
the phase detector includes an MM baud-rate phase detector.

8. The semiconductor integrated circuit according to claim 6, wherein
when a transition between the fourth value and the fifth value is a first pattern, the sixth value is equal to the fourth value, and the seventh value is equal to the fifth value, and
when the transition between the fourth value and the fifth value is not the first pattern, the sixth value and the seventh value are both zero.

9. A receiver device comprising:
a semiconductor integrated circuit; and
a data processing circuit configured to use data output from the semiconductor integrated circuit,
wherein the semiconductor integrated circuit includes:
a converter configured to convert an analog signal into a digital signal based on a clock signal;
a comparator configured to determine first data having data of a first number of bits per symbol and second data having data of a second number of bits, less than the first number, per symbol based on the digital signal;
a recovery circuit configured to recover the clock signal; and
a control circuit configured to input the digital signal and the first data to the recovery circuit in a case where a condition is not satisfied, and to input the digital signal and the second data to the recovery circuit in a case where the condition is satisfied.

10. The receiver device according to claim 9, wherein
the case where the condition is satisfied includes a case where an elapsed time from a start of reception of the analog signal is equal to or longer than a threshold, or a case where a phase of the clock signal recovered by the recovery circuit has been locked.

11. The receiver device according to claim 9, further comprising
an update circuit configured to update a tap coefficient that is used for an arithmetic operation on the digital signal,
wherein the control circuit is configured to stop updating of the tap coefficient performed by the update circuit in the case where the condition is not satisfied, and to update the tap coefficient by the update circuit in the case where the condition is satisfied.

12. The receiver device according to claim 9, further comprising
an update circuit configured to update a tap coefficient that is used for an operation on the digital signal regardless of whether or not the condition is satisfied.

13. The receiver device according to claim 9, wherein
the first data has 2-bit data per symbol, and
the second data has 1-bit data per symbol.

14. The receiver device according to claim 9, wherein
the recovery circuit includes a phase detector configured to calculate a first value related to a phase of the clock signal based on the digital signal and the first data or the second data,
the digital signal has a second value sampled at a first timing and a third value sampled at a second timing different from the first timing,
the first data has a fourth value corresponding to the second value and a fifth value corresponding to the third value,
the second data has a sixth value corresponding to the second value and a seventh value corresponding to the third value, and
the phase detector is configured to calculate the first value based on a difference between a product of the second value and the fifth value and a product of the third value and the fourth value or a difference between a product of the second value and the seventh value and a product of the third value and the sixth value.

15. The receiver device according to claim 14, wherein
the phase detector includes an MM baud-rate phase detector.

16. The receiver device according to claim 14, wherein
when a transition between the fourth value and the fifth value is a first pattern, the sixth value is equal to the fourth value, and the seventh value is equal to the fifth value, and
when the transition between the fourth value and the fifth value is not the first pattern, the sixth value and the seventh value are both zero.

17. A semiconductor integrated circuit comprising:
a converter configured to convert an analog signal into a digital signal based on a clock signal;
a comparator configured to determine first data having data of two or more bits per symbol based on the digital signal; and
a filter circuit configured to filter the first data according to a transition of bit data between a pair of the symbols to generate third data;
a recovery circuit configured to recover the clock signal; and
a control circuit configured to input the digital signal and the first data to the recovery circuit in a case where a condition is not satisfied, and to input the digital signal and the third data to the recovery circuit in a case where the condition is satisfied.

18. The semiconductor integrated circuit according to claim 17, wherein the case where the condition is satisfied includes a case where an elapsed time from a start of reception of the analog signal is equal to or longer than a threshold, or a case where a phase of the clock signal recovered by the recovery circuit has been locked.

19. The semiconductor integrated circuit according to claim 17, further comprising
an update circuit configured to update a tap coefficient that is used for an operation on the digital signal regardless of whether or not the condition is satisfied.

20. A receiver device comprising:
the semiconductor integrated circuit according to claim 17; and
a data processing circuit configured to use data output from the semiconductor integrated circuit.

* * * * *